United States Patent
Ikenishi

(10) Patent No.: US 9,473,118 B2
(45) Date of Patent: Oct. 18, 2016

(54) SEMICONDUCTOR DEVICE AND METHOD OF CONTROLLING SEMICONDUCTOR DEVICE

(71) Applicant: FUJITSU LIMITED, Kawasaki-shi, Kanagawa (JP)

(72) Inventor: Kiyoshi Ikenishi, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/830,043

(22) Filed: Aug. 19, 2015

(65) Prior Publication Data

US 2016/0072483 A1    Mar. 10, 2016

(30) Foreign Application Priority Data

Sep. 8, 2014   (JP) .................................. 2014-182249

(51) Int. Cl.
| | |
|---|---|
| *H03K 3/00* | (2006.01) |
| *H03K 3/037* | (2006.01) |
| *H03K 5/15* | (2006.01) |
| *H03K 19/003* | (2006.01) |

(52) U.S. Cl.
CPC .......... *H03K 3/0372* (2013.01); *H03K 5/1502* (2013.01); *H03K 5/15066* (2013.01); *H03K 5/15093* (2013.01); *H03K 19/00361* (2013.01)

(58) Field of Classification Search
None
See application file for complete search history.

(56) References Cited

U.S. PATENT DOCUMENTS

| | | | | |
|---|---|---|---|---|
| 3,956,616 A | * | 5/1976 | Knollenberg | G01N 15/1429 377/10 |
| 6,246,267 B1 | * | 6/2001 | Barsoum | G01R 19/25 327/78 |
| 7,180,301 B1 | * | 2/2007 | Hynes | G01R 19/2513 324/102 |
| 2016/0072483 A1 | * | 3/2016 | Ikenishi | H03K 3/0372 327/202 |

FOREIGN PATENT DOCUMENTS

| | | |
|---|---|---|
| JP | 4-321318 | 11/1992 |
| JP | 11-74768 | 3/1999 |
| JP | 11-296268 | 10/1999 |
| JP | 2004-13820 | 1/2004 |

\* cited by examiner

*Primary Examiner* — Long Nguyen
(74) *Attorney, Agent, or Firm* — Staas & Halsey LLP

(57) ABSTRACT

A semiconductor device including: a plurality of function block units each including a plurality of latch circuits; a current prediction unit that predicts a variation amount of current consumed by each of the function block units; an operation control unit that, if any of the variation amounts predicted by the current prediction unit exceeds a threshold value, operates the latch circuits included in a predetermined number of target function block units for a predetermined period, the predetermined number of target function block units being chosen from function block units not operating among the plurality of function block units; and a restore control unit that, after the predetermined period passes, restores information held by the latch circuits included in the predetermined number of target function block units, to information held by the latch circuits before the operation for the predetermined period.

11 Claims, 18 Drawing Sheets

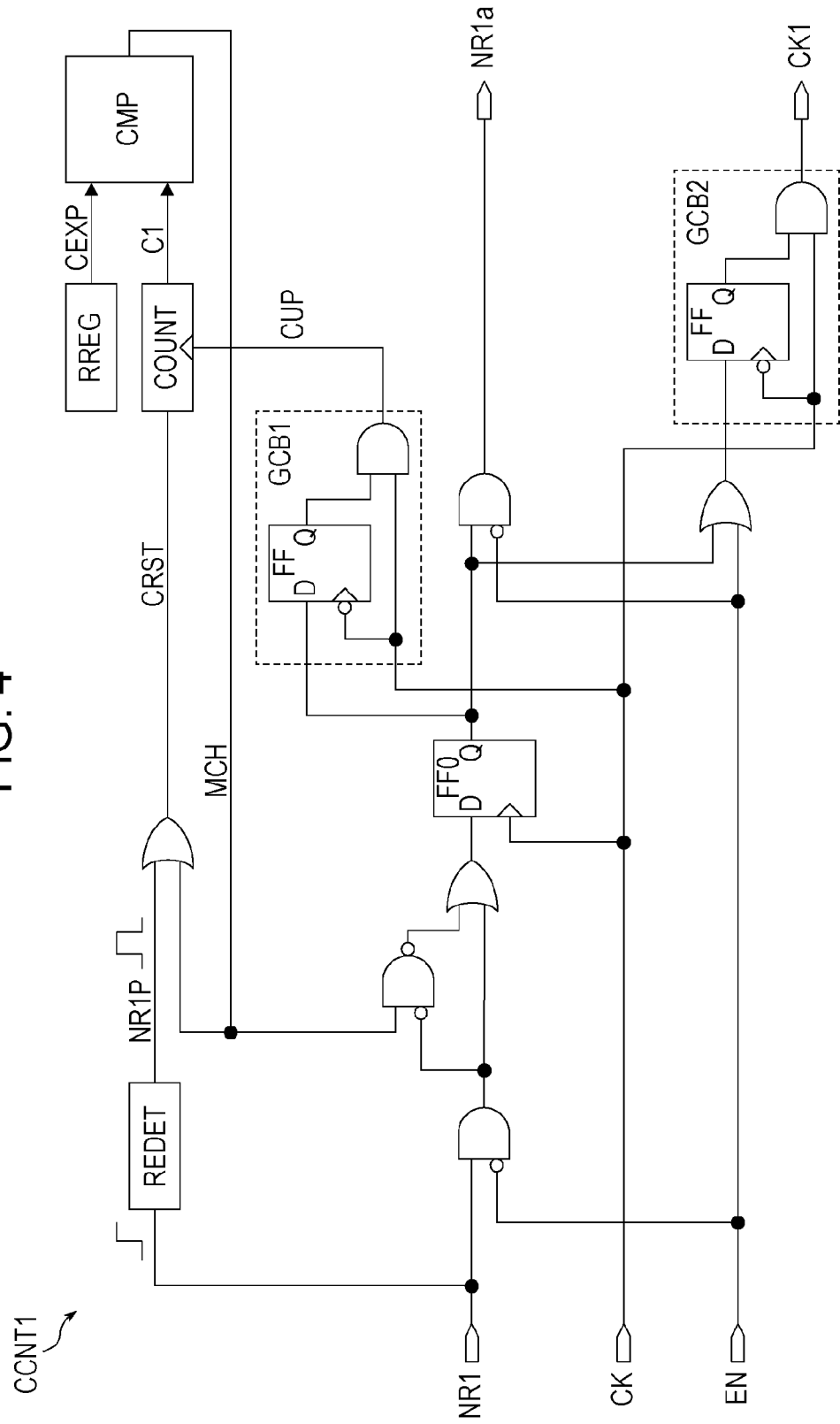

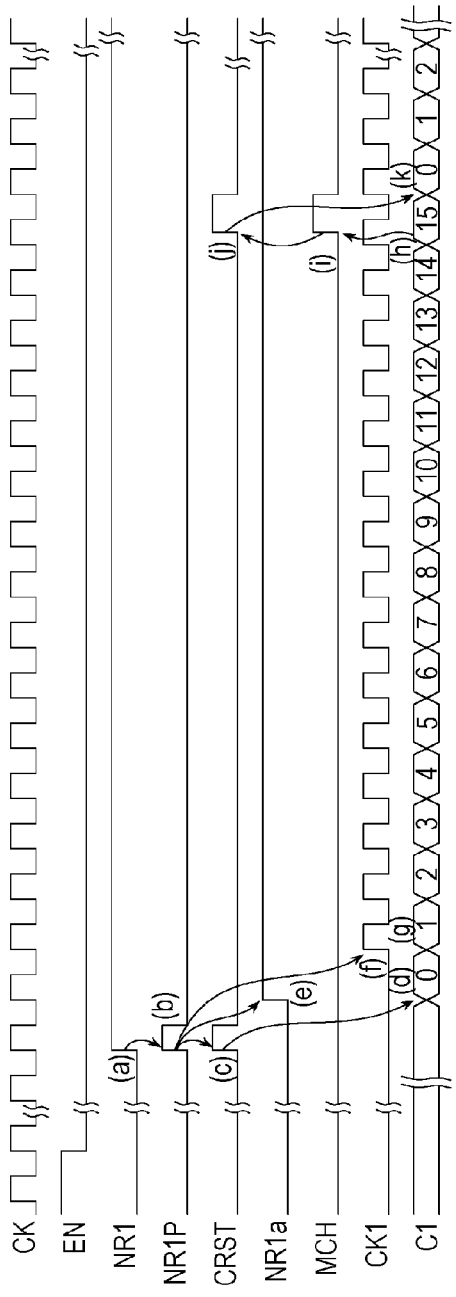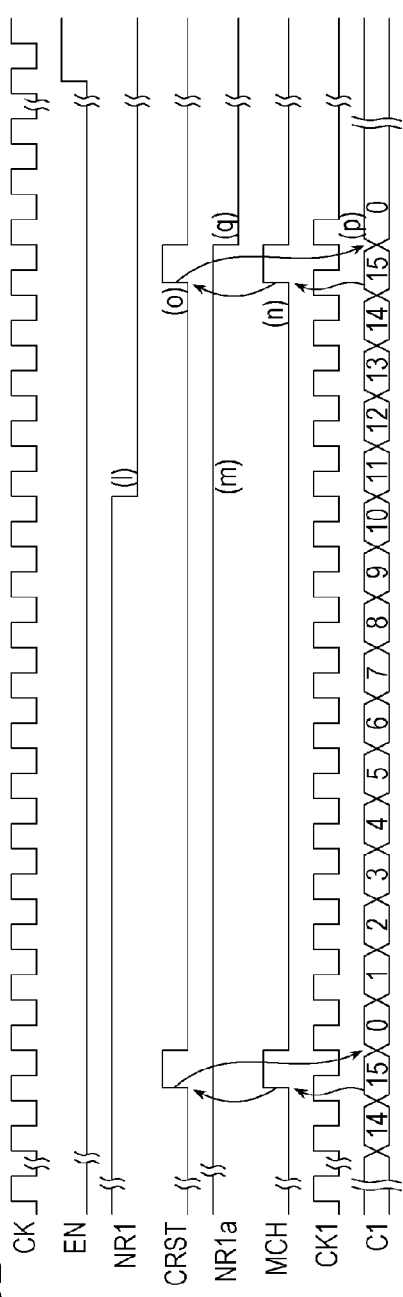

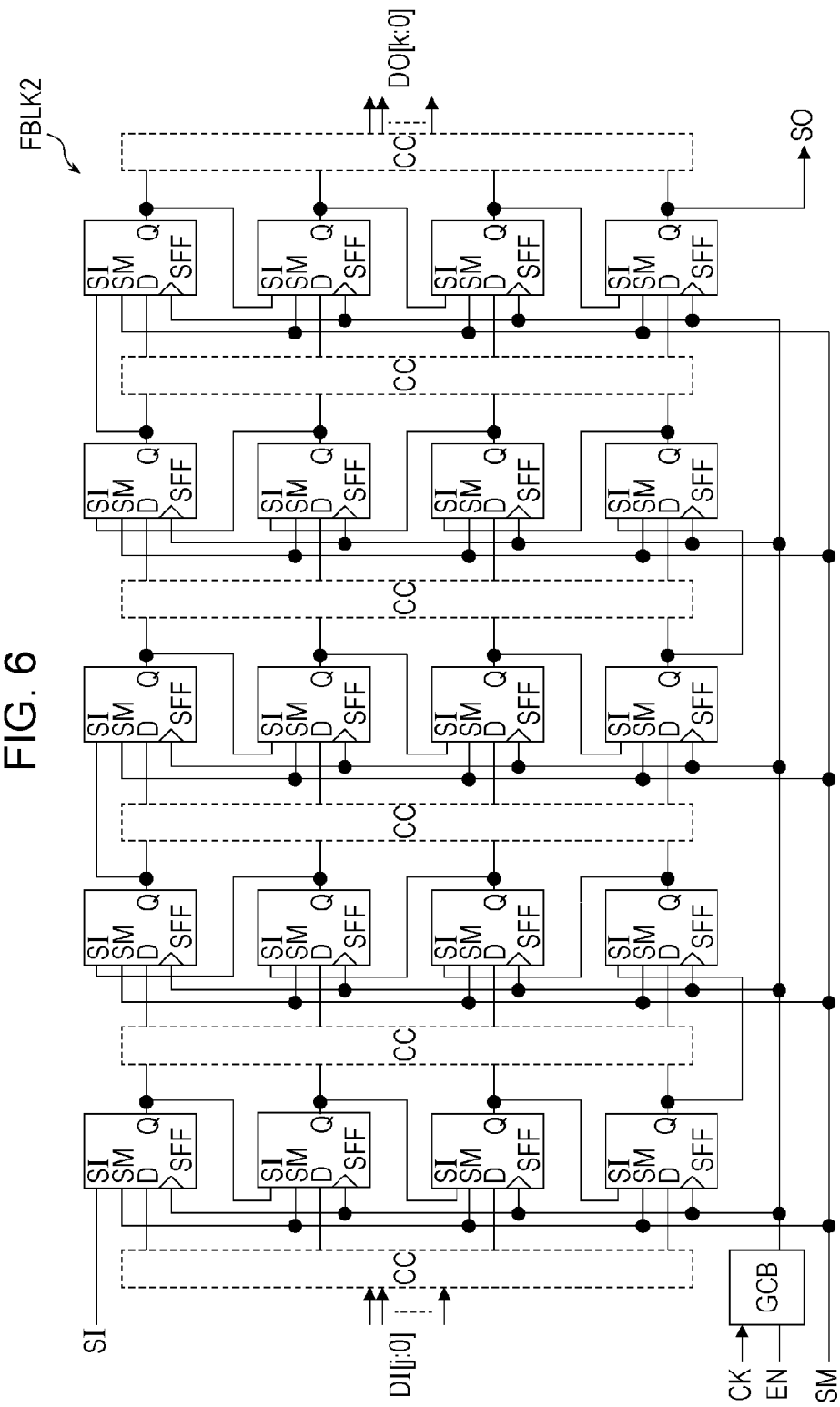

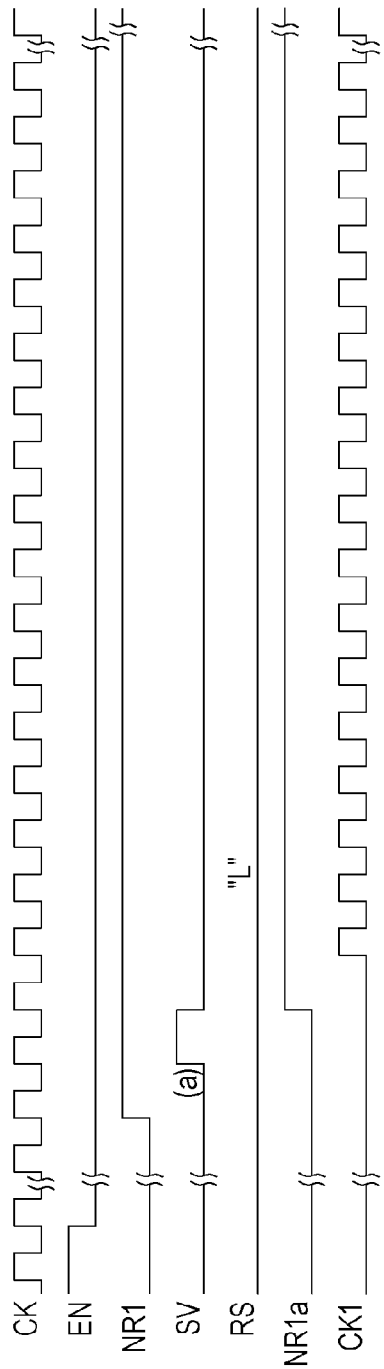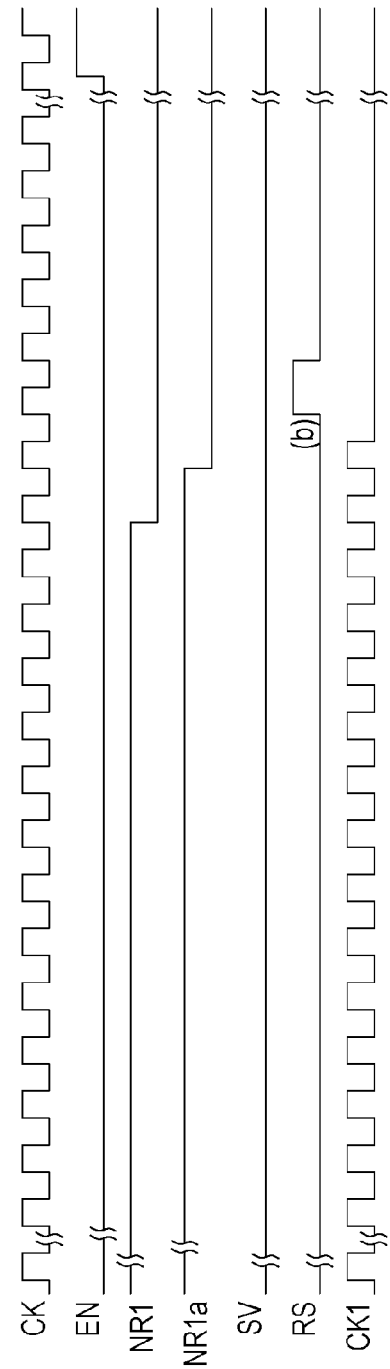

SEMICONDUCTOR DEVICE AND METHOD OF CONTROLLING SEMICONDUCTOR DEVICE

CROSS-REFERENCE TO RELATED APPLICATION

This application is based upon and claims the benefit of priority of the prior Japanese Patent Application No. 2014-182249, filed on Sep. 8, 2014, the entire contents of which are incorporated herein by reference.

FIELD

The embodiments discussed herein are related to a semiconductor device, and a method of controlling the semiconductor device.

BACKGROUND

In a semiconductor device, a sudden change in power supply current due to start or stop of operations of multiple circuit blocks may cause a power supply noise in some cases. To address this, a technique of reducing the occurrence of a power supply noise is proposed, in which a semiconductor device is caused to consume approximately the same power by operating, in accordance with a change in the power supply current, unused latch circuits which are not involved in the operation of the semiconductor device (for example, see Japanese Laid-open Patent Publication No. 11-296268). Moreover, a technique of gradually changing the frequency of a clock when starting or stopping the supply of the clock to a clock synchronization circuit is proposed so that a sudden change in the power supply current is reduced and the occurrence of a power supply noise is reduced (for example, see Japanese Laid-open Patent Publications No. 4-321318 and No. 2004-13820).

However, the number of unused latch circuits is determined depending on the design of each semiconductor device, so that the technique of reducing the occurrence of a power supply noise by operating the unused latch circuits is applicable only to limited semiconductor devices.

A semiconductor device and a method of controlling the semiconductor device discussed herein are aimed to reduce the occurrence of a power supply noise by utilizing a latch circuit to be used for implementing a function of the semiconductor device.

SUMMARY

According to an aspect of the invention, an semiconductor device including: a plurality of function block units each including a plurality of latch circuits; a current prediction unit that predicts a variation amount of current consumed by each of the function block units; an operation control unit that, if any of the variation amounts predicted by the current prediction unit exceeds a threshold value, operates the latch circuits included in a predetermined number of target function block units for a predetermined period, the predetermined number of target function block units being chosen from function block units not operating among the plurality of function block units; and a restore control unit that, after the predetermined period passes, restores information held by the latch circuits included in the predetermined number of target function block units, to information held by the latch circuits before the operation for the predetermined period.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating an example of a chain control circuit illustrated in FIG. 3;

FIGS. 5A and 5B are diagrams illustrating an example of an operation of the chain control circuit illustrated in FIG. 4;

FIG. 6 is a diagram illustrating an example of a function block unit FBLK2 illustrated in FIG. 2;

FIGS. 14A and 14B are diagrams illustrating an example of an operation of the chain control circuit illustrated in FIG. 13;

DESCRIPTION OF EMBODIMENTS

Figure 1:
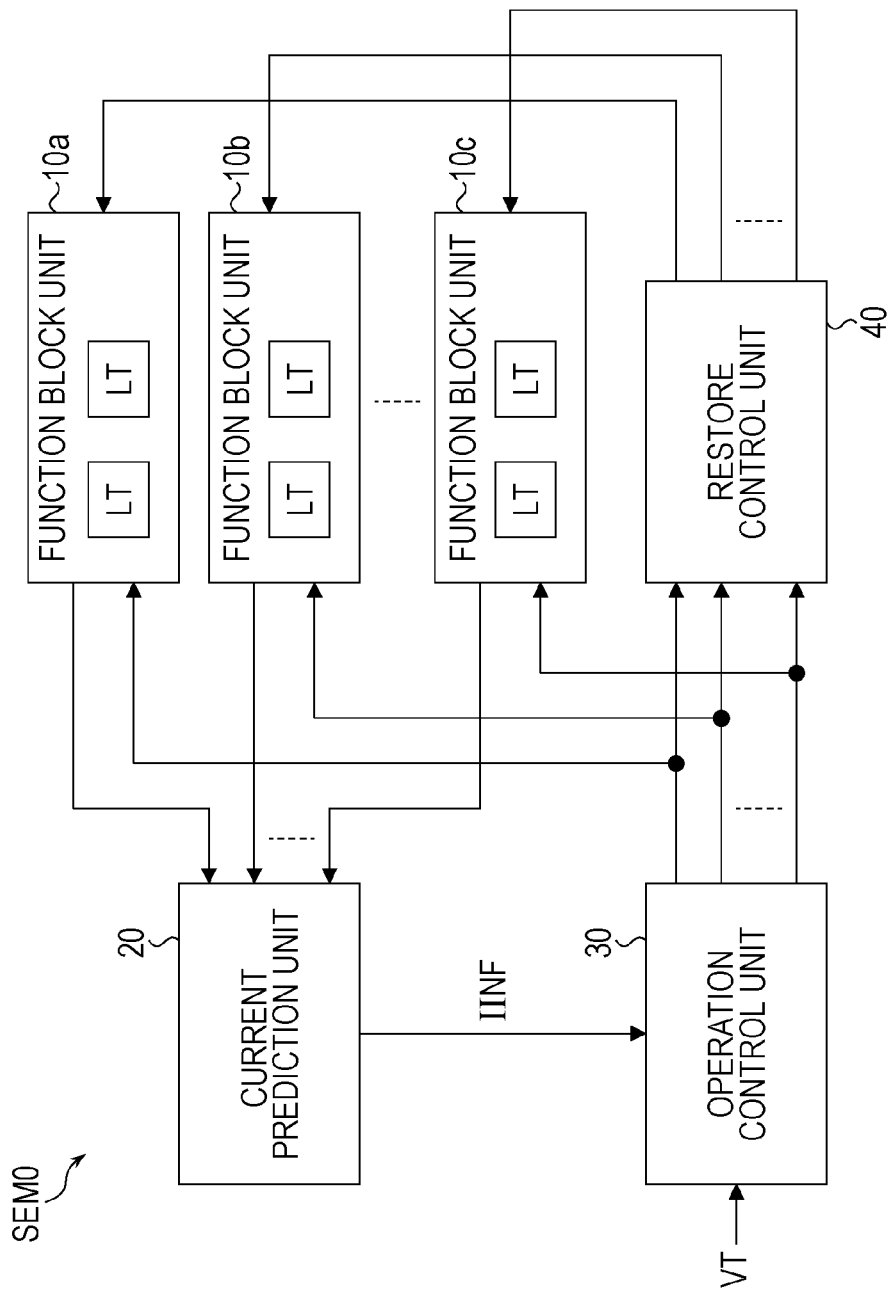
FIG. 1 is a diagram illustrating one embodiment of a semiconductor device and a method of controlling the semiconductor device.

Hereinafter, embodiments will be described using the drawings. The same reference numeral as a signal is used for a signal line through which the signal is transmitted.

FIG. 1 illustrates one embodiment of a semiconductor device and a method of controlling the semiconductor device. A semiconductor device SEM0 illustrated in FIG. 1 includes multiple function block units 10 (10a, 10b, and 10c), a current prediction unit 20, an operation control unit 30, and a restore control unit 40. Each of the function block units 10 includes multiple latch circuits LT. The current prediction unit 20 predicts, based on the current consumed by each of the function block units 10a, 10b, and 10c, a variation amount IINF of the current consumed by each of the function block units 10a, 10b, and 10c (in other words, a variation amount of power supply current of the semiconductor device SEM0). The current prediction unit 20 may predict the variation amount IINF of the current based on information indicating an operation state of each of the function block units 10a, 10b, and 10c, or may predict the variation amount IINF of the current based on a measurement result of the current consumed by each of the function block units 10a, 10b, and 10c.

When the variation amount IINF predicted by the current prediction unit 20 exceeds a threshold value VT, the operation control unit 30 selects, as target function block units, a certain number function block units 10 not operating from the function block units 10. The operation control unit 30 then operates the multiple latch circuits LT included in the selected target function block units for a certain period. Consumption of the current due to the operations of the latch circuits LT results in a slow change in power supply current of the semiconductor device SEM0, thereby reducing the occurrence of a power supply noise.

After the latch circuits LT are operated for the certain period, the restore control unit 40 restores information (in other words, logic) held by the latch circuits LT that are included in the target function block unit selected by the operation control unit 30, to original information held by the latch circuits LT before the operation for the certain period. This enables the semiconductor device SEM0 to be restored to a state before the variation amount IINF exceeding the threshold value VT is detected, and to continue the operation.

As described above, in the embodiment illustrated in FIG. 1, the latch circuits LT in the function block unit 10 not operating are used to consume the current for a certain period, and thereafter the information held by the latch circuits LT is restored to the original information. This allows the occurrence of a power supply noise to be reduced by utilizing the latch circuits that are used for implementing the function of the semiconductor device SEM0.

Figure 2:
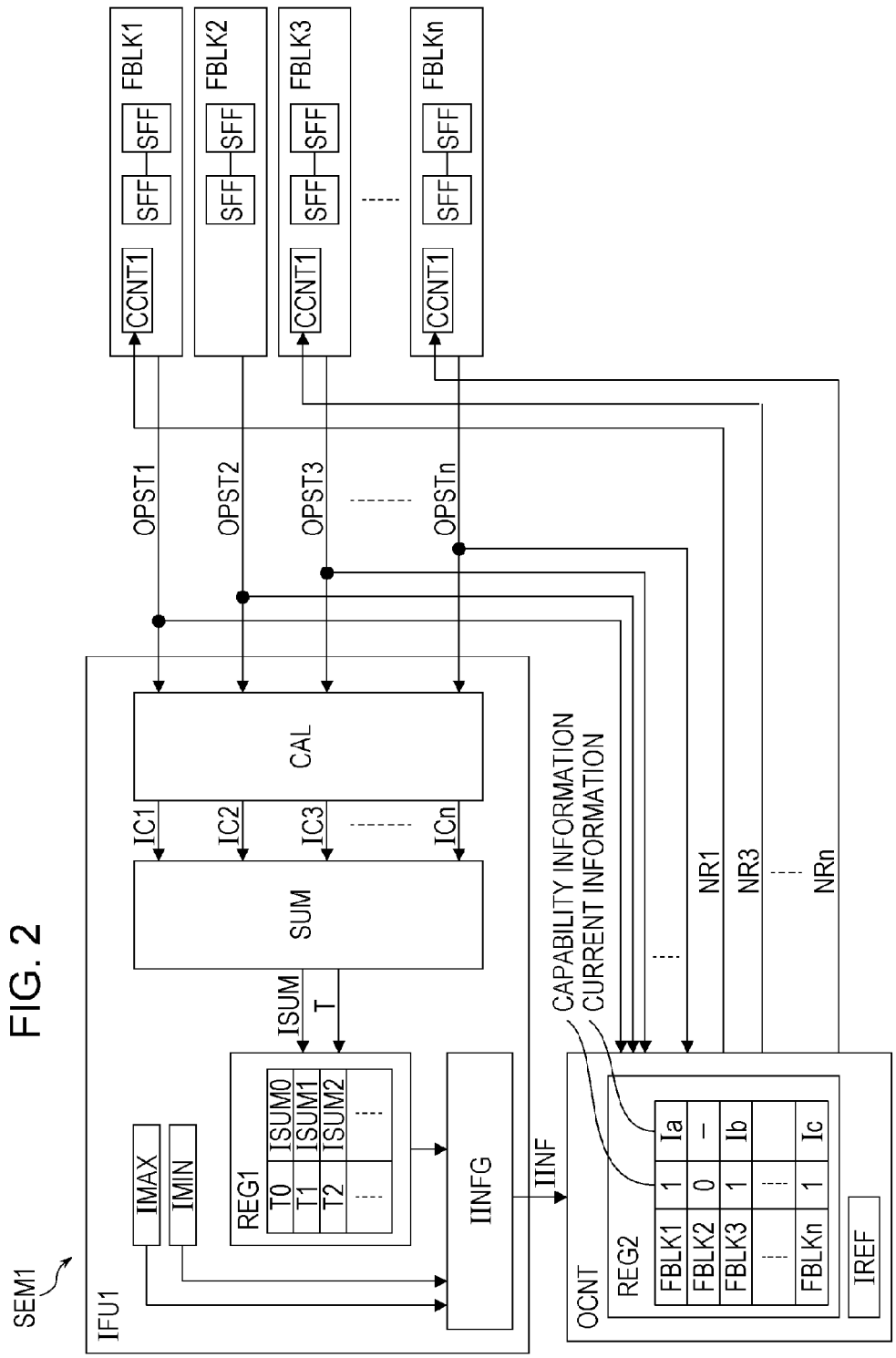
FIG. 2 is a diagram illustrating another embodiment of a semiconductor device and a method of controlling the semiconductor device.

FIG. 2 illustrates another embodiment of a semiconductor device and a method of controlling the semiconductor device. A semiconductor device SEM1 illustrated in FIG. 2 includes n function block units FBLK (FBLK1, FBLK2, FBLK3, . . . , and FBLKn), a current prediction unit IFU1, and an operation control unit OCNT. For example, the semiconductor device SEM1 is a system large scale integration (LSI) having a form of system on a chip (SoC) or the like. Each of the function block units FBLK is a peripheral function block unit of an analog to digital converter (ADC), a video decoder, or an audio decoder, or the like and includes multiple scanning flip-flops SFF that are connected in series when each function is tested. The scanning flip-flops SFF are an example of flip-flops that are connected in series between a scanning input terminal and a scanning output terminal.

Each function block unit FBLK has a function to output operation state information OPST (OPST1, OPST2, OPST3, . . . , or OPSTn) indicating an operation state. The operation state information OPST is information indicating an operation mode of each function block unit FBLK or information indicating a transition state of a state machine incorporated in each function block unit FBLK, and has a correlation with the current consumption of each function block unit FBLK. The operation state information OPST is used in the current prediction unit IFU1 for determining the consumed current of each function block unit FBLK, and is used in the operation control unit OCNT for determining whether the function block unit FBLK is being operated.

The function block units FBLK1, FBLK3, and FBLKn each include a chain control circuit CCNT1 that controls connection of the scanning flip-flops SFF. The function block units FBLK1, FBLK3, and FBLKn that include the chain control circuits CCNT1 may be shifted to a noise reduction mode in which the current is intentionally increased. Note that, the chain control circuit CCNT1 may be provided outside of each of the function block units FBLK1, FBLK3, and FBLKn.

The function block units FBLK1, FBLK3, and FBLKn receive noise reduction signals NR (NR1, NR3, and NRn) during a period when operations of implementing functions of the function block units FBLK1, FBLK3, and FBLKn are stopped, and are shifted to the noise reduction mode. The function block units FBLK1, FBLK3, and FBLKn while being shifted to the noise reduction mode execute scanning operations of the scanning flip-flops SFF, and consume the current. The scanning operation is executed by applying a pseudo scanning pattern to the scanning flip-flops SFF.

Figure 3:
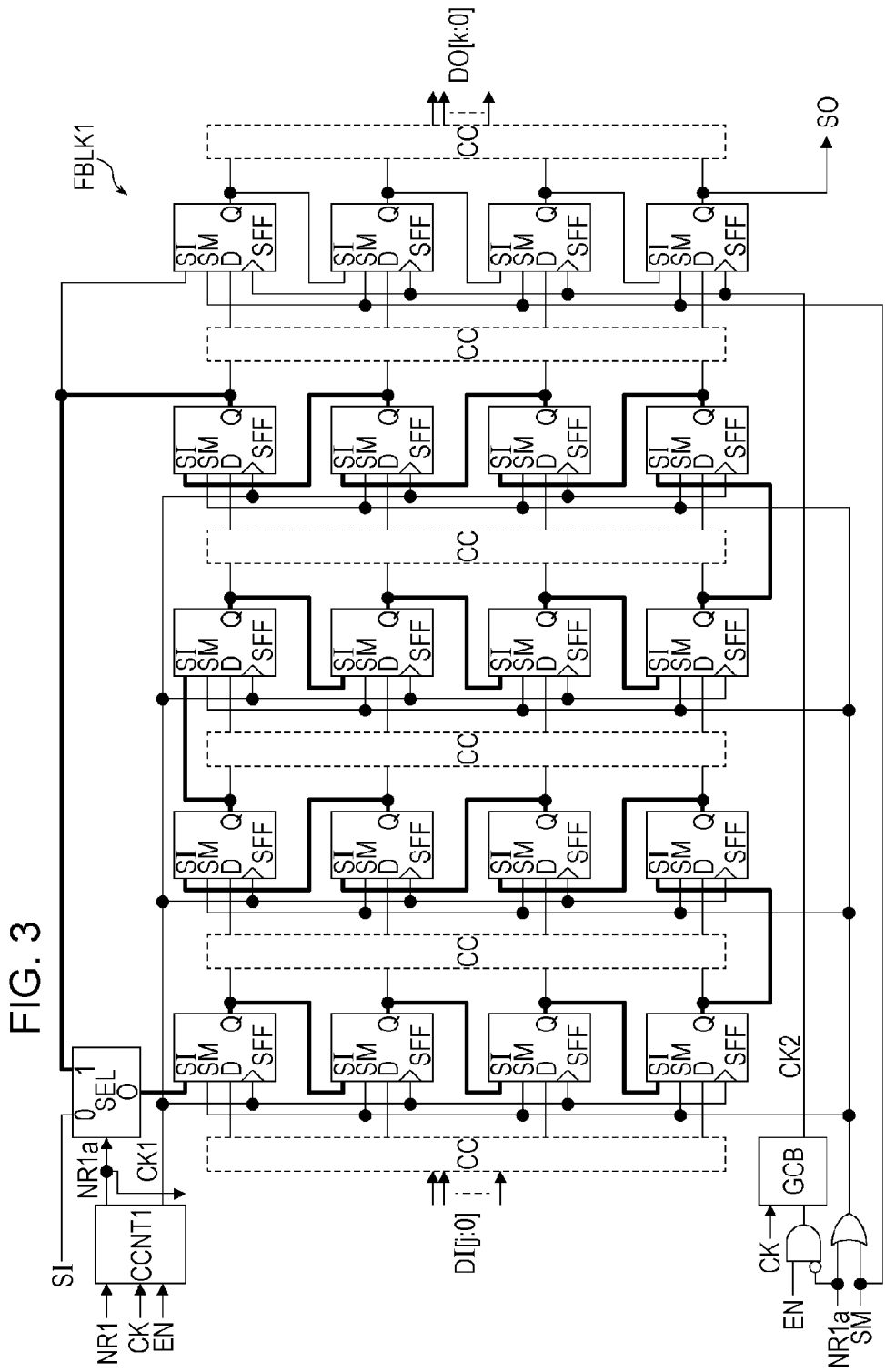
FIG. 3 is a diagram illustrating an example of a function block unit FBLK1 illustrated in FIG. 2.

In contrast, the function block unit FBLK2 continuously implements the function of the function block unit FBLK2 without stopping the operation, for example, so that the function block unit FBLK2 does not include the chain control circuit CCNT1 and does not shift to the noise reduction mode. FIG. 3 illustrates an example of the function block units FBLK1, FBLK3, and FBLKn, FIG. 4 illustrates an example of the chain control circuit CCNT1, and FIG. 6 illustrates an example of the function block unit FBLK2.

The current prediction unit IFU1 includes a current calculation unit CAL, a current total unit SUM, registers REG1, IMAX and IMIN, and a current information generation unit IINFG. The current calculation unit CAL obtains current information IC (IC1, IC2, IC3, . . . , and ICn) indicating the current consumed by each function block unit FBLK, based on the operation state information OPST outputted from each function block unit FBLK. The current calculation unit CAL may obtain the current information IC based on a computational expression, or may obtain the current information IC based on a table in which a correspondence between the operation state information OPST and the current information IC is stored. The semiconductor device SEM1 including the current calculation unit CAL may obtain the current consumed by each function block unit FBLK without mounting a current sensor or the like thereon.

The current total unit SUM obtains a total ISUM of current values indicated by the current information IC1 to ICn obtained by the current calculation unit CAL, and stores in the register REG1 the obtained total ISUM with a time T when the total ISUM is obtained. The current total unit SUM obtains the total ISUM of the current values at a certain frequency, for example, every hundreds of microseconds or several milliseconds.

The register REG1 includes multiple regions in which the time T (T0, T1, T2, . . . ) when the total ISUM of the current values is obtained and the total ISUM (ISUM0, ISUM1, ISUM2, . . . ) of the current values are stored. The register IMAX holds information indicating a maximum value of the current consumed by the semiconductor device SEM1. The register IMIN holds information indicating a minimum value of the current consumed by the semiconductor device SEM1. Hereinafter, a current value indicated by the information held by the register IMAX is referred to as a maximum current IMAX, and a current value indicated by the information held by the register IMIN is referred to as a minimum current IMIN. For example, the minimum current IMIN is a standby current that is consumed in a state where the operations of all of the function block units FBLK are stopped. The standby current is a current (power supply current) that is consumed by a leak current flowing through an element such as a transistor included in the semiconductor device SEM1.

The current information generation unit IINFG obtains a tendency of the change in power supply current of the semiconductor device SEM1 based on the total ISUM of the current values for each time T stored in the register REG1. When the power supply current is on an upward trend, the current information generation unit IINFG predicts a period of time before the power supply current reaches the maximum current IMAX, and obtains a variation amount of the power supply current when reaching the maximum current IMAX, as a prediction value. When the power supply current is on a downward trend, the current information generation unit IINFG predicts a period of time before the power supply current reaches the minimum current IMIN, and obtains a variation amount of the power supply current when reaching the minimum current IMIN, as a prediction value. The current information generation unit IINFG then outputs current information IINF indicating the predicted period of time and the obtained variation amount, to the operation control unit OCNT.

The operation control unit OCNT includes registers REG2 and IREF. The register REG2 has regions in which the capability information and the current information are stored for every function block unit FBLK. Capability information being "1" indicates that the function block unit FBLK may be shifted to a noise reduction mode in which the current is intentionally increased, whereas capability information being "0" indicates that the function block unit FBLK is prohibited from shifting to the noise reduction mode. Current information Ia, Ib, or Ic indicates a current value that is intentionally consumed during the noise reduction mode. In the register REG2, "-" for the current information corresponding to the function block unit FBLK2 that is not shifted to the noise reduction mode indicates that no current information is stored, or indicates that current information is invalid.

The register IREF holds information indicating a reference current for determining whether any of the function block units FBLK is shifted to the noise reduction mode. Hereinafter, a current value indicated by the information held by the register IREF is referred to as a reference current IREF.

When the prediction value of the variation amount of power supply current included in the current information IINF exceeds the reference current IREF, the operation control unit OCNT shifts any of the function block units FBLK to the noise reduction mode. The reference current IREF is an example of a threshold value for determining whether any of the function block units FBLK is shifted to the noise reduction mode. When the prediction value of the variation amount of power supply current included in the current information IINF is not more than the reference current IREF, the operation control unit OCNT shifts none of the function block units FBLK to the noise reduction mode.

When shifting any of the function block units FBLK to the noise reduction mode, the operation control unit OCNT detects, based on operation state information OPST outputted from each function block unit FBLK, a non-operating function block unit that is the function block unit FBLK the operation of which has been stopped. The operation control unit OCNT then selects, among the non-operating function block units, a predetermined number of function block units FBLK to be shifted to the noise reduction mode for reducing the power supply noise that occurs when the power supply current fluctuates in accordance with the current information IINF. The operation control unit OCNT outputs noise reduction signals NR (NR1, NR3, and NRn) corresponding to the selected function block units FBLK for a predetermined period. The scanning flip-flops SFF in the function block unit FBLK that is shifted to the noise reduction mode based on the noise reduction signal NR are operated for the predetermined period to consume the current for reducing the power supply noise.

Note that, when the semiconductor device SEM1 includes a central processing unit (CPU), the current prediction unit IFU1 and the operation control unit OCNT may be implemented by the CPU and a program that the CPU executes.

FIG. 3 illustrates an example of the function block unit FBLK1 illustrated in FIG. 2. The configurations of the function block units FBLK3 and FBLKn that also have the noise reduction mode are similar to that in FIG. 3, except for receiving noise reduction signals NR3 and NRn, respectively, instead of the noise reduction signal NR1. Note that, a circuit that generates the operation state information OPST illustrated in FIG. 2 is omitted in FIG. 3.

The function block unit FBLK1 includes the chain control circuit CCNT1, a selector SEL, a gate clock buffer GCB, a plurality of combinational circuits CC, and the plurality of scanning flip-flops SFF that are placed between the combinational circuits CC. A path that circularly connects the scanning flip-flops SFF and illustrated by the thick line indicates a path through which a scanning pattern is transmitted by the scanning operation during the noise reduction mode.

Each combinational circuit CC includes circuits to implement the function of the function block unit FBLK1. In FIG. 3, the combinational circuit CC at the first stage receives data DI of a j+1 bit (j is a positive integer) to be operated, and the combinational circuit CC at the last stage outputs data DO of a k+1 bit (k is a positive integer).

When receiving a high-level enable signal EN during a normal mode in which the function of the function block unit FBLK1 is implemented, the chain control circuit CCNT1 sets a noise reduction signal NR1$a$ to the low level, and outputs a clock CK1 in synchronization with a clock CK. Similarly, when receiving a high-level enable signal EN during a test mode in which the function block unit FBLK1 is tested, the chain control circuit CCNT1 sets a noise reduction signal NR1$a$ to the low level, and outputs a clock CK1 in synchronization with a clock CK. The chain control circuit CCNT1 sets a noise reduction signal NR1$a$ to the high level based on a rising edge of the noise reduction signal NR1, and outputs a clock CK1 in synchronization with a clock CK, during the noise reduction mode. Moreover, the chain control circuit CCNT1 holds the value that the scanning flip-flop SFF holds before the noise reduction mode based on a falling edge of the noise reduction signal NR1, during the noise reduction mode. Thereafter, the chain control circuit CCNT1 sets the noise reduction signal NR1$a$ at the low level, and stops the output of the clock CK1.

The selector SEL outputs a logic that is received on an input terminal assigned with "0" through a scanning input terminal SIN during the noise reduction signal NR1a being at the low level, from an output terminal O. The selector SEL outputs a logic that is received at the input terminal assigned with "1" during the noise reduction signal NR1a being at the high level, from the output terminal O.

The gate clock buffer GCB outputs a clock CK2 in synchronization with the clock CK during the enable signal EN at the high level and the noise reduction signal NR1a at the low level. The gate clock buffer GCB stops the output of the clock CK2 in synchronization with the clock CK when the enable signal EN is at the low level or the noise reduction signal NR1a is at the high level. The gate clock buffer GCB has a circuit configuration similar to that of the gate clock buffers GCB1 and GCB2 illustrated in FIG. 4.

The scanning flip-flop SFF that is connected to the path illustrated by the thick line receives a signal at the high level on a scanning mode terminal SM to execute a scanning operation while the noise reduction signal NR1a is at the high level or a scanning mode signal SM is at the high level. The scanning flip-flop SFF that is not connected to the path illustrated by the thick line receives a signal at the high level on a scanning mode terminal SM to execute a scanning operation while the scanning mode signal SM is at the high level, and functions as a shift register.

In the test mode in which the function block unit FBLK is tested, after test patterns in series that are supplied through the scanning input terminals SI are successively held by the scanning flip-flops SFF, the combinational circuits CC operate. Further, the logics of signals outputted from the respective combinational circuits CC are held by the respective scanning flip-flops SFF, and data of test results in series is outputted from the function block unit FBLK through a scanning output terminal SO.

In the noise reduction mode, the scanning flip-flops SFF that are circularly connected through the path illustrated by the thick line function as feedback shift registers, and cyclically transfer the held logics via the selector SEL. Further, the scanning flip-flops SFF that are circularly connected repeat latch operations in synchronization with the clock CK1, and consume the current. Moreover, the combinational circuit CC that is connected to output terminals Q of the scanning flip-flops SFF operates in accordance with data outputted from the output terminals Q, and consume the current. The noise reduction mode is ended at a time when the logics held by the scanning flip-flops SFF are circulated once and the scanning flip-flops SFF hold the logics having held before the noise reduction mode is started.

The logic held by each scanning flip-flop SFF does not change before and after the noise reduction mode. This allows the current to be consumed by utilizing the scanning flip-flops SFF and the combinational circuits CC, which are in use in the function block unit FBLK that implements the function of the semiconductor device SEM1. Moreover, after the noise reduction mode is ended, the combinational circuit CC that is connected to the output terminals Q of the scanning flip-flops SFF receives the logic the same as the logic having been received before the noise reduction mode, and may continue the operation having been executed before the noise reduction mode.

How many rounds the logic held by the scanning flip-flop SFF goes through the path illustrated by the thick line during the noise reduction mode is determined based on a period of the noise reduction signal NR1 being set to the high level. In FIG. 3, although 16 scanning flip-flop SFF are circularly connected during the noise reduction mode, the number of the scanning flip-flops SFF that are circularly connected is not limited to 16.

FIG. 4 illustrates an example of the chain control circuit CCNT1 illustrated in FIG. 3. FIGS. 5A and 5B illustrate an example of an operation of the chain control circuit CCNT1. Note that, FIG. 4 illustrates the example of the chain control circuit CCNT1 that is mounted to the function block unit FBLK1 in FIG. 2. The chain control circuit CCNT1 that is mounted to the function block unit FBLK3 or FBLKn in FIG. 2 is implemented by replacing the noise reduction signal NR1 with the noise reduction signal NR3 or the noise reduction signal NRn.

The chain control circuit CCNT1 includes an edge detection circuit REDET, a counter COUNT, a register RREG, a comparator CMP, a flip-flop FF0, the gate clock buffers GCB1 and GCB2, and various logic gates.

The edge detection circuit REDET detects a rising edge of the noise reduction signal NR1, and generates a high-level pulse signal NR1P. The counter COUNT resets a counter value C1 in response to a reset signal CRST that is generated based on the pulse signal NR1P or a match signal MCH.

The counter COUNT performs a count operation in synchronization with a count-up signal CUP outputted from the gate clock buffer GCB1 to increment the counter value C1 by "1". The comparator CMP outputs the match signal MCH when the counter value C1 reaches an expected value CEXP held by the register RREG. Here, the expected value CEXP is set to a value ("15") corresponding to the number (16 pieces) of the scanning flip-flops SFF that are connected by the thick line and illustrated in FIG. 3. The counter COUNT, the register RREG, and the comparator CMP are an example of a count unit that repeatedly counts the number of the scanning flip-flops SFF that are connected by the thick line and illustrated in FIG. 3 based on the prediction value of the variation amount of power supply current exceeding the reference current IREF.

The flip-flop FF0 outputs a signal at the high level in synchronization with the change of the noise reduction signal NR1 to the high level during a period when the enable signal EN is at the low level. Moreover, the flip-flop FF0 outputs a signal at the low level in synchronization with the output of the match signal MCH after the noise reduction signal NR1 has changed to the low level. The gate clock buffer GCB1 outputs a count-up signal CUP in synchronization with a falling edge of the clock CK during a period when the flip-flop FF0 outputs a signal at the high level.

The noise reduction signal NR1a is held at the low level during a period when the enable signal EN is at the high level, and is set to the logic that the flip-flop FF0 outputs during a period when the enable signal EN is at the low level. The gate clock buffer GCB2 outputs a clock CK1 in synchronization with the clock CK during a period when the enable signal EN is at the high level or during a period when the flip-flop FF0 outputs a signal at the high level.

FIGS. 5A and 5B illustrate an example of an operation of the chain control circuit CCNT1 illustrated in FIG. 4. First, as illustrated in FIG. 5A, the operation control unit OCNT illustrated in FIG. 2 changes a noise reduction signal NR1 to the high level while an enable signal EN is at the low level. Based on the noise reduction signal NR1, a pulse signal NR1P is outputted and a reset signal CRST is outputted ((a), (b), and (c) in FIG. 5A). Based on the reset signal CRST, a counter value C1 of the counter COUNT is reset to "0" ((d) in FIG. 5A).

Moreover, in response to the change of the noise reduction signal NR1 to the high level, a noise reduction signal NR1a is changed to the high level and the function block unit FBLK is shifted to the noise reduction mode ((e) in FIG. 5A). In a next clock cycle after the noise reduction signal NR1a is changed to the high level, the output of the clock CK1 is started and the counter COUNT increments the counter value C1 by "1" ((f) and (g) in FIG. 5A). During a period when the clock CK1 is outputted, the scanning flip-flops SFF connected by the thick line illustrated in FIG. 3 perform the scanning operations and cyclically shift the logics via the selector SEL.

When the counter value C1 that is incremented by "1" matches an expected value CEXP (=15) illustrated in FIG. 4, the comparator CMP outputs a match signal MCH ((h) and (i) in FIG. 5A). Based on the match signal MCH, a reset signal CRST is generated, and the counter value C1 of the counter COUNT is reset to "0" ((j) and (k) in FIG. 5A). The match signal MCH indicates that the logics held by the scanning flip-flops SFF that are connected by the thick line illustrated in FIG. 3 are restored to the logic before the noise reduction mode.

Thereafter, as illustrated in FIG. 5B, the operation control unit OCNT illustrated in FIG. 2 changes the noise reduction signal NR1 to the low level ((l) in FIG. 5B). However, during a period when the match signal MCH is at the low level, the output from the flip-flop FF0 illustrated in FIG. 4 is maintained at the high level, so that the noise reduction signal NR1a does not change to the low level ((m) in FIG. 5B). This suppresses the completion of the noise reduction mode before the scanning flip-flops SFF that are connected by the thick line in FIG. 3 hold the original logics, and suppresses the error operation of the function block unit FBLK after the completion of the noise reduction mode.

When the counter value C1 matches the expected value CEXP and the match signal MCH is outputted, the reset signal CRST is generated and the counter value C1 of the counter COUNT is reset to "0" ((n), (o), and (p) in FIG. 5B). Further, the flip-flop FF0 outputs a signal at the low level based on the output of the match signal MCH to change the noise reduction signal NR1a to the low level and stop the output of the clock CK1, so that the noise reduction mode is ended ((q) in FIG. 5B).

In this manner, the period of the noise reduction mode is set based on the output cycle of the match signal MCH (in other words, the cycle when the scanning flip-flops SFF that are connected by the thick line in FIG. 2 hold the original logics) as a unit. As a result, at the time when the noise reduction mode is ended, the logic held by the scanning flip-flops SFF is restored to the original logic before being shifted to the noise reduction mode.

FIG. 6 illustrates an example of the function block unit FBLK2 illustrated in FIG. 2. Detailed explanations of the elements the same as or similar to those of the function block unit FBLK1 illustrated in FIG. 3 are omitted.

The function block unit FBLK2 does not include the chain control circuit CCNT1, the selector SEL, and the circuit that receives the noise reduction signal NR1, which are included in the function block unit FBLK1 illustrated in FIG. 3. Further, the scanning input terminal SI is directly connected to the scanning flip-flop SFF at the first stage, an enable terminal EN is directly connected to the gate clock buffer GCB, and the scanning mode terminal SM is directly connected to each of the scanning flip-flops SFF.

Figure 7:
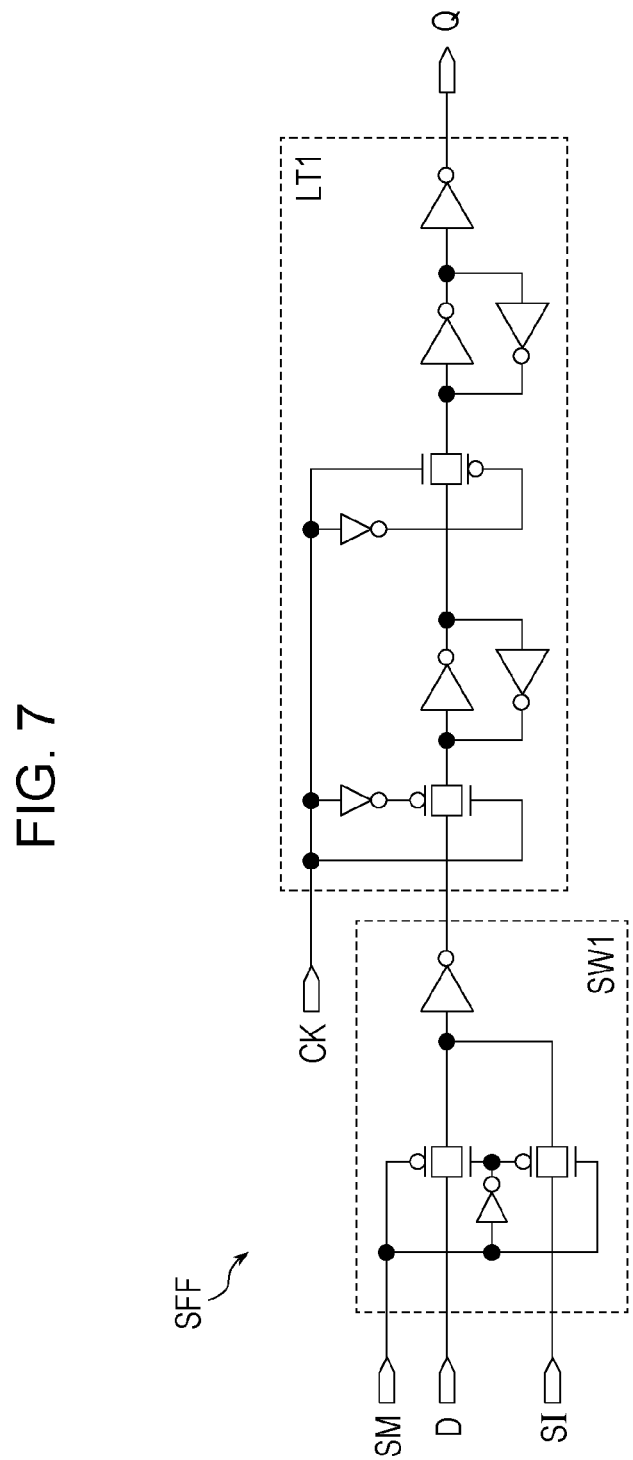
FIG. 7 is a diagram illustrating an example of a scanning flip-flop illustrated in FIGS. 3 and 6.

FIG. 7 illustrates an example of the scanning flip-flop SFF illustrated in FIGS. 3 and 6. The scanning flip-flop SFF includes a switching unit SW1 and a latch unit LT1. The switching unit SW1 outputs data that is received at a data terminal to the latch unit LT1 during a low-level period of a signal that is received at the scanning mode terminal SM. Moreover, the switching unit SW1 outputs a logic pattern that is received at the scanning input terminal SI to the latch unit LT1 during a high-level period of a signal that is received at the scanning mode terminal SM. The latch unit LT1 holds the data or the logic pattern that is received via the switching unit SW1.

A signal that is supplied to the scanning mode terminal SM is set to the low level during the normal mode in which the function block unit FBLK operates for implementing the function of the semiconductor device SEM1. Moreover, a signal that is supplied to the scanning mode terminal SM is set to the high level during the test mode in which the function block unit FBLK is tested or during the noise reduction mode for executing the scanning operation for the scanning flip-flops SFF that are chain-connected.

The latch unit LT1 latches data or a logic pattern that is received via the switching unit SW1 in synchronization with a clock that is received at a clock terminal CK, and outputs the latched data or logic pattern from an output terminal Q.

Figure 8:
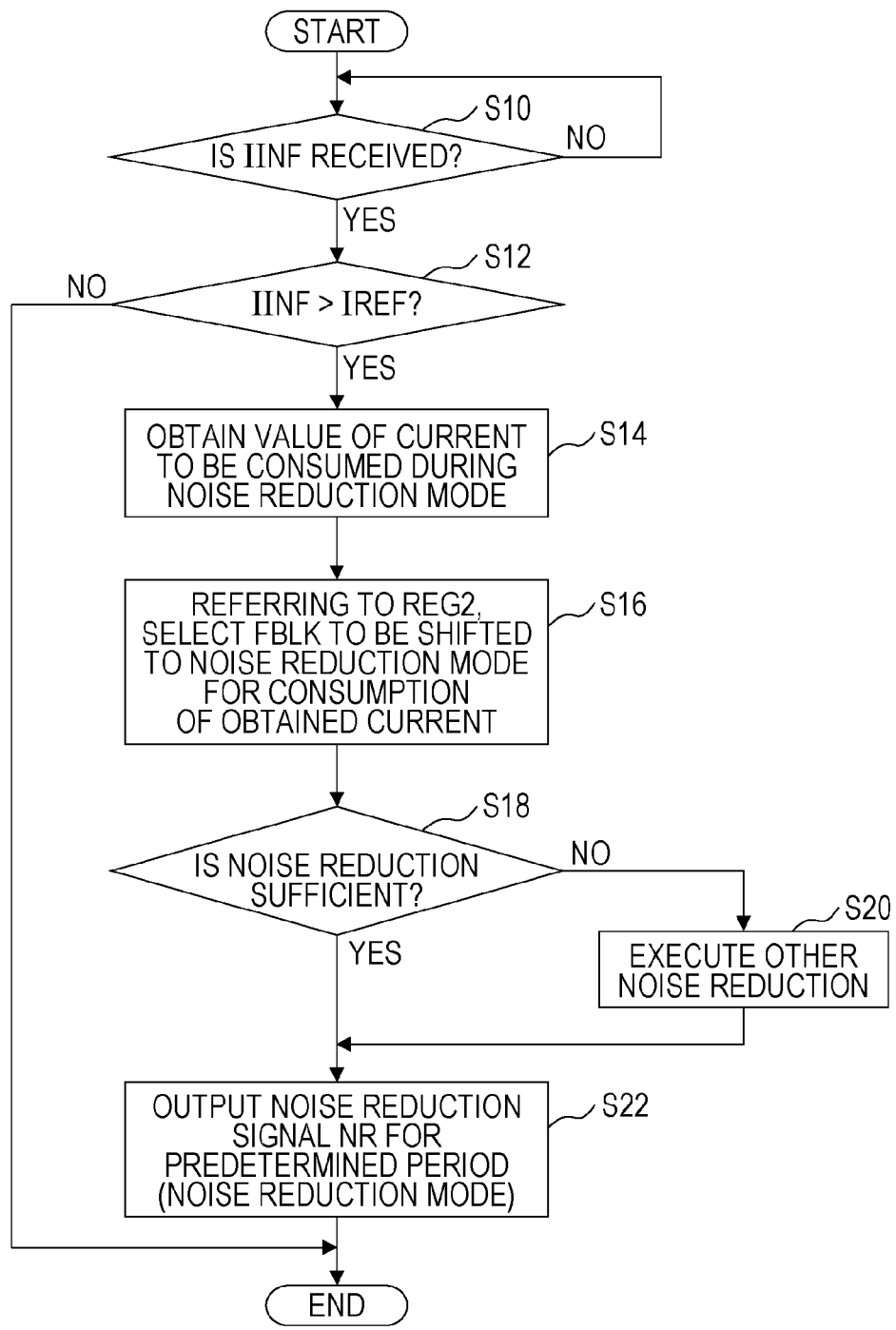
FIG. 8 is a flowchart illustrating an example of an operation of an operation control unit illustrated in FIG. 2.

FIG. 8 illustrates an example of an operation of the operation control unit OCNT illustrated in FIG. 2. The operation illustrated in FIG. 8 may be implemented by a hardware or may be implemented by software.

Figure 9:
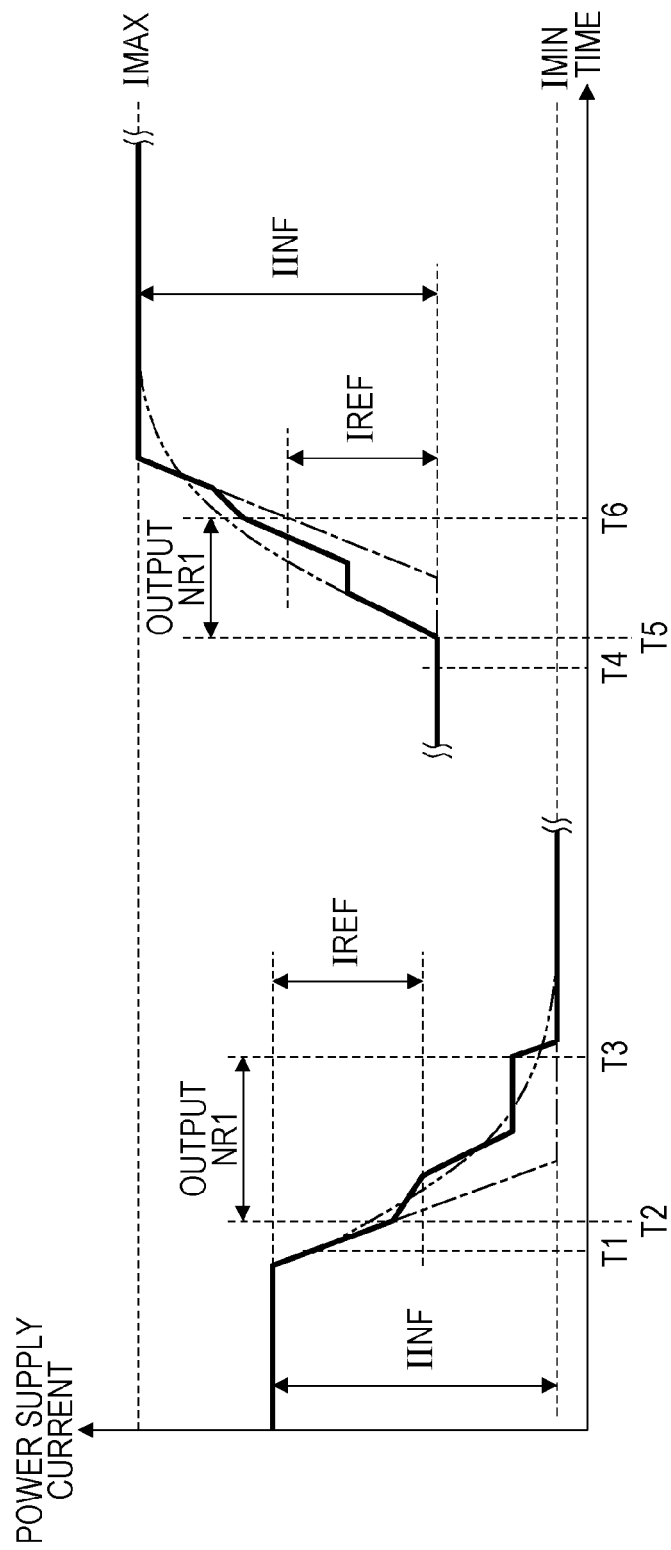
FIG. 9 is a graph illustrating an example of the change in power supply current during a noise reduction mode in the semiconductor device illustrated in FIG. 2.
Figure 10:
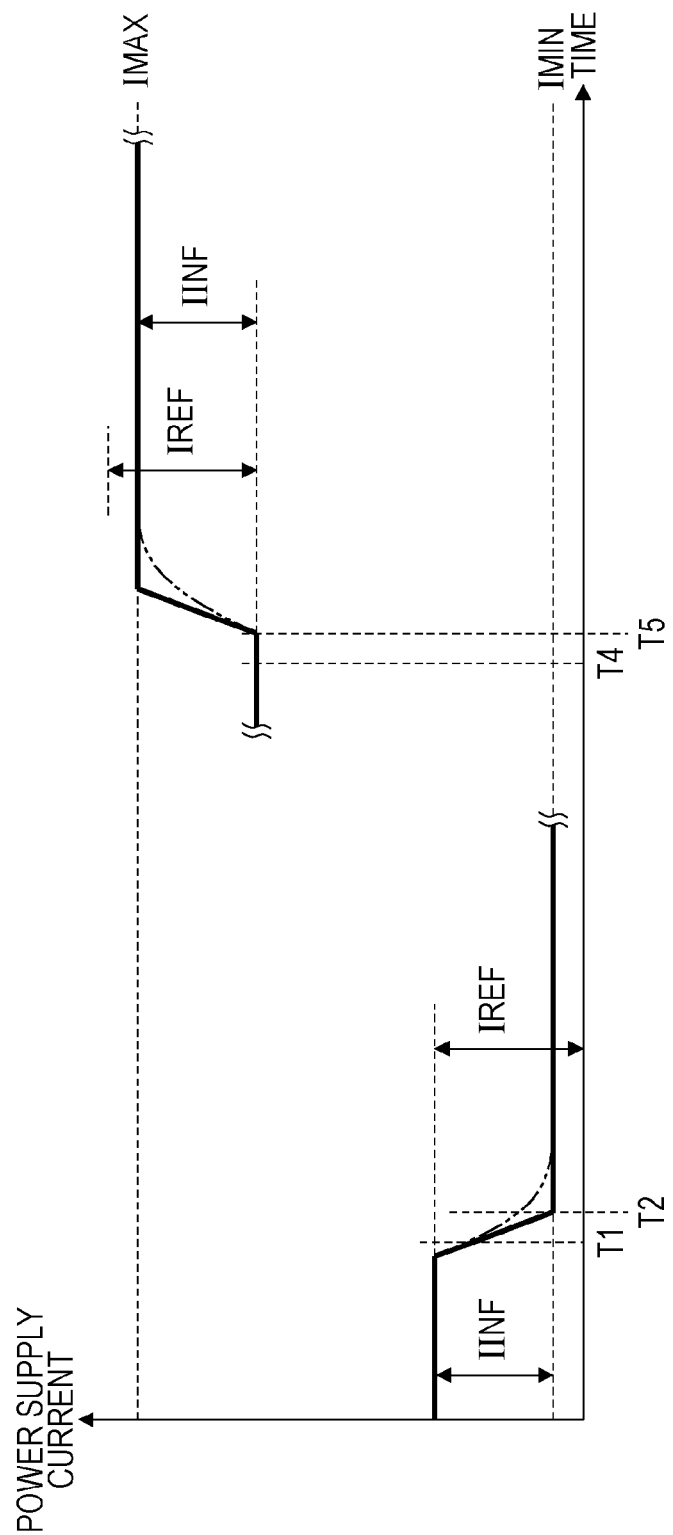
FIG. 10 is a graph illustrating an example of the change in power supply current when the noise reduction mode is not started up in the semiconductor device illustrated in FIG. 2.

First, the operation control unit OCNT waits for reception of current information IINF from the current information generation unit IINFG at Step S10. If current information IINF is received, at Step S12, the operation control unit OCNT determines whether a prediction value of the variation amount of power supply current indicated by the current information IINF is more than a reference current IREF. If the prediction value of the variation amount of power supply current indicated by the current information IINF is more than the reference current IREF, the operation control unit OCNT proceeds the processing to Step S14 for executing the noise reduction. If the prediction value of the variation amount of power supply current indicated by the current information IINF is not more than the reference current IREF, the operation control unit OCNT does not execute the noise reduction, and thus ends the operation. After ending the operation, the operation control unit OCNT again executes the process at Step S10. FIG. 9 illustrates an example of waveforms of power supply current when the noise reduction is executed, and FIG. 10 illustrates an example of waveforms of power supply current when the noise reduction is not executed.

At Step S14, the operation control unit OCNT obtains a value of current to be consumed during the noise reduction mode based on the information indicated by the current information IINF. Next, at Step S16, the operation control unit OCNT refers to the register REG2 illustrated in FIG. 2, and selects a function block unit FBLK to be shifted to the noise reduction mode for the consumption of the current obtained at Step S14.

Next, at Step S18, the operation control unit OCNT determines whether the current to be consumed in the function block unit FBLK selected at Step S16 is sufficient for the noise reduction. If the current is sufficient for the power supply noise reduction, the operation control unit OCNT proceeds the processing to Step S22, whereas if the current is insufficient for the power supply noise reduction, the operation control unit OCNT proceeds the processing to Step S20.

At Step S20, the operation control unit OCNT executes other power supply noise reduction such as reduction in frequency of the clock CK. Meanwhile, at Step S22, the operation control unit OCNT outputs a noise reduction signal NR corresponding to the function block unit FBLK selected at Step S16 for a predetermined period for the shifting to the noise reduction mode. After outputting the noise reduction signal NR for the predetermined period, the operation control unit OCNT again executes the process at Step S10.

FIG. 9 illustrates an example of the change in power supply current during the noise reduction mode in the semiconductor device SEM1 illustrated in FIG. 2. In FIG. 9, the thick line illustrates the change in power supply current when the power supply noise reduction at Step S22 in FIG. 8 is executed. The dot-and-dash line illustrates the change in power supply current when the noise reduction is not executed, and the dash-dot-dot line illustrates the change in power supply current when a stabilization capacitance is applied to a power supply line of the semiconductor device SEM1, instead of the power supply noise reduction at Step S22 in FIG. 8.

First, at a time T1, a current prediction unit IFU1 outputs, based on operation state information OPST from the function block unit FBLK, current information IINF indicating that the power supply current abruptly varies to the operation control unit OCNT. At a time T2, the operation control unit OCNT outputs the noise reduction signal NR, and shifts a certain number of the function block units FBLK to the noise reduction mode because the variation amount of current indicated by the current information IINF is more than the reference current IREF.

Further, during a period from the time T2 to a time T3, the chain control circuit CCNT1 in the function block unit FBLK that is shifted to the noise reduction mode executes the operation illustrated in FIGS. 5A and 5B, and consumes the current. This causes the power supply current to mildly decline as similar to a case where the stabilization capacitance is added. An end time T3 of the noise reduction mode may be determined based on a time interval before the power supply current predicted by the current information generation unit IINFG reaches the minimum current IMIN, or may be determined based on the prediction value of the variation amount of power supply current that is indicated by the current information IINF.

Similarly, at a time T4, the current prediction unit IFU1 predicts that the power supply current abruptly varies, based on operation state information OPST from the function block unit FBLK, and outputs current information IINF indicating the variation amount of current to the operation control unit OCNT. At a time T5, the operation control unit OCNT outputs the noise reduction signal NR, and shifts a certain number of the function block units FBLK to the noise reduction mode because the variation amount of current indicated by the current information IINF is more than the reference current IREF.

Further, during a period from the time T5 to a time T6, the chain control circuit CCNT1 in the function block unit FBLK that is shifted to the noise reduction mode executes the operation illustrated in FIGS. 5A and 5B, and consumes the current. This causes the power supply current to mildly rise as similar to a case where the stabilization capacitance is added. Note that, the end time T6 of the noise reduction mode may be determined based on a time interval before the power supply current predicted by the current information generation unit IINFG reaches the maximum current IMAX, or may be determined based on the prediction value of the variation amount of power supply current that is indicated by the current information IINF.

FIG. 10 illustrates an example of the change in power supply current when the noise reduction mode is not started up in the semiconductor device SEM1 illustrated in FIG. 2. Similarly to FIG. 9, the dash-dot-dot line illustrates the change in power supply current when a stabilization capacitance is applied to a power supply line of the semiconductor device SEM1, instead of the power supply noise reduction at Step S22 in FIG. 8.

In the example illustrated in FIG. 10, the operation control unit OCNT does not output the noise reduction signal NR because the variation amount of current indicated by the current information IINF is not more than the reference current IREF. Accordingly, the function block unit FBLK is not shifted to the noise reduction mode, and the power supply current has a waveform similar to a waveform obtained when the noise reduction mode is not executed. Meanwhile, when the variation amount of current is not more than the reference current IREF, a waveform of the power supply current is similar to a waveform of the power supply current when the stabilization capacitance is added to the power supply line, and no power supply noise that affects the operation of the semiconductor device SEM1 is generated.

As described above, also in the embodiment illustrated in FIG. 2 to FIG. 10, similar to the embodiment illustrated in FIG. 1, the occurrence of a power supply noise may be reduced by utilizing the scanning flip-flops SFF that are used for implementing the function of the semiconductor device SEM1. In addition, in the embodiment illustrated in FIGS. 2 to 10, the current calculation unit CAL may obtain the current consumed by each function block unit FBLK, based on the operation state information OPST indicating the operation state of each function block unit FBLK. In other words, the semiconductor device SEM1 may obtain the current consumed by each function block unit FBLK without mounting thereon a current sensor or the like that detects current.

Moreover, the chain control circuit CCNT1 adjusts a time for completing the noise reduction mode to a time when the counter COUNT will complete counting of the number (=16) of the scanning flip-flops SFF that are connected by the thick line in FIG. 3. This allows the logics held by the scanning flip-flops SFF to be restored to the original logics when the noise reduction mode is completed, independent of the output period of the noise reduction signal NR from the operation control unit OCNT. As a result, an error operation of the function block unit FBLK after being restored from the noise reduction mode may be reduced.

Figure 11:
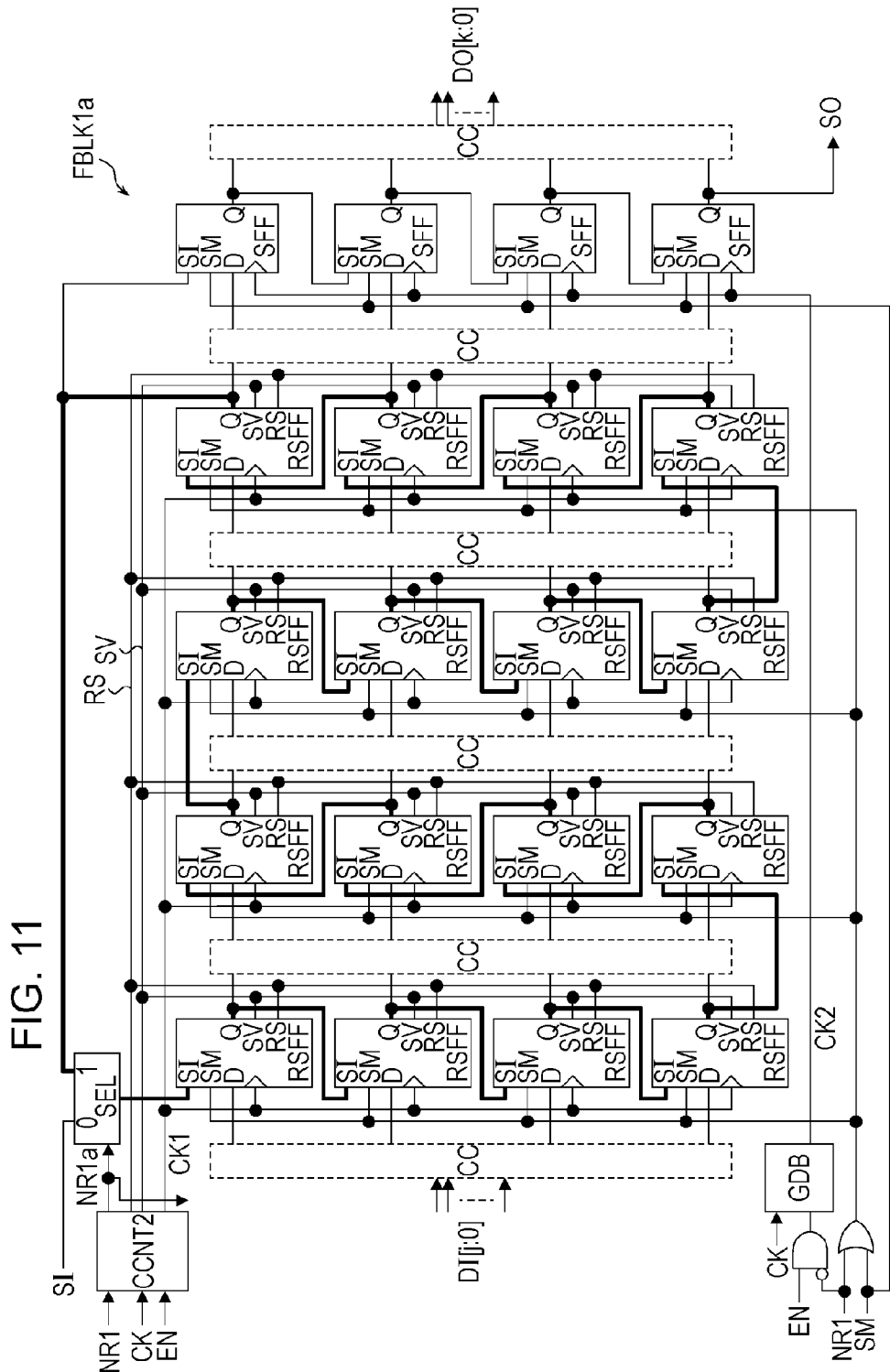
FIG. 11 is a diagram illustrating an example of a function block unit in a semiconductor device and a method of controlling the semiconductor device according to another embodiment.

FIG. 11 illustrates an example of a function block unit FBLK1a in a semiconductor device and a method of controlling the semiconductor device according to another embodiment. The semiconductor device includes the function block unit FBLK1a instead of the function block unit FBLK1 illustrated in FIG. 2. Moreover, the function block units FBLK3 and FBLKn illustrated in FIG. 2 have a configuration similar to that of the function block unit FBLK1a illustrated in FIG. 11, and receive noise reduction signals NR3 and NRn, respectively, instead of the noise reduction signal NR1. Other configuration of the semiconductor device is similar to that in FIG. 2. In other words, an operation of an operation control unit of the semiconductor device that includes the function block unit FBLK1a illustrated in FIG. 11 is similar to that in FIG. 8, and the change in power supply current during the noise reduction mode is similar to that in FIG. 9.

In the function block unit FBLK1a illustrated in FIG. 11, scanning flip-flops to which the thick line is connected are not the scanning flip-flops SFF illustrated in FIG. 3, but retention flip-flops RSFF. Each retention flip-flop RSFF includes a shadow latch unit SLT (FIG. 12) that retracts the logic held by the latch unit LT1 (FIG. 12) based on a save signal SV. The logic saved in the shadow latch unit SLT may be restored in the latch unit LT1 based on a restore signal RS.

Figure 13:
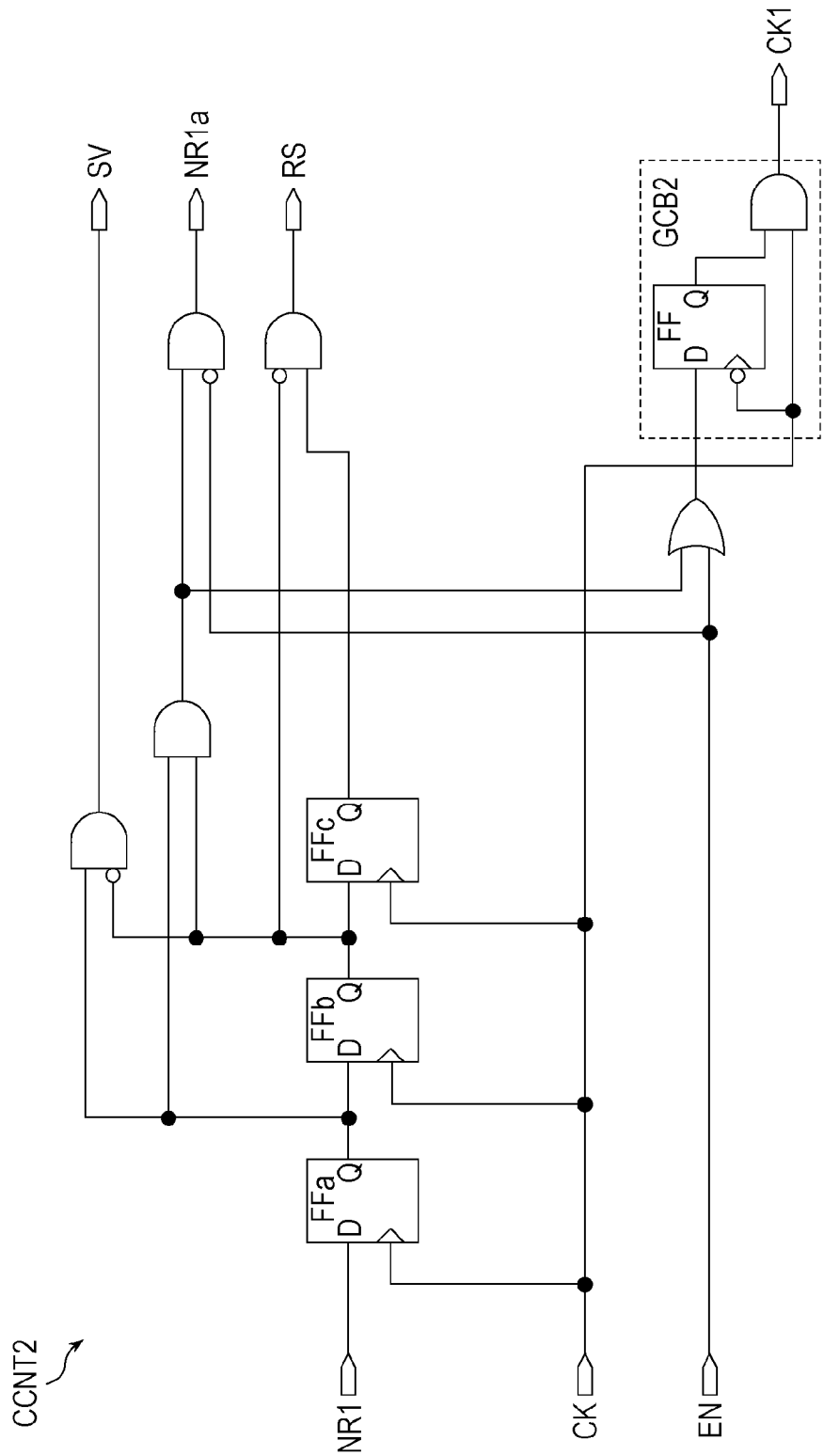
FIG. 13 is a diagram illustrating an example of a chain control circuit illustrated in FIG. 11.

A chain control circuit CCNT2 has a function to generate the save signal SV and the restore signal RS in addition to the function of the chain control circuit CCNT1 illustrated in FIG. 3. FIG. 13 illustrates an example of the chain control circuit CCNT2, and FIGS. 14A and 14B illustrate an example of an operation of the chain control circuit CCNT2. Other configuration of the function block unit FBLK1a is similar to that of the function block unit FBLK1 illustrated in FIG. 3.

The function block unit FBLK1a retracts the logic to the shadow latch unit SLT based on the save signal SV before being shifted to the noise reduction mode. Moreover, the function block unit FBLK1a returns the logic of the shadow latch unit SLT to the latch unit LT1 based on the restore signal RS after being returned to the normal mode from the noise reduction mode. This allows the retention flip-flops RSFF to be returned to the original state after the noise reduction mode, independent of the number of clock cycles in which the logics are circulated through a signal line illustrated by the thick line during the noise reduction mode. In other words, a period during the noise reduction mode may be set to any number of clock cycles, and the current that is consumed during the noise reduction mode may be set more precisely than that in the scanning flip-flops SFF illustrated in FIG. 3.

Figure 12:
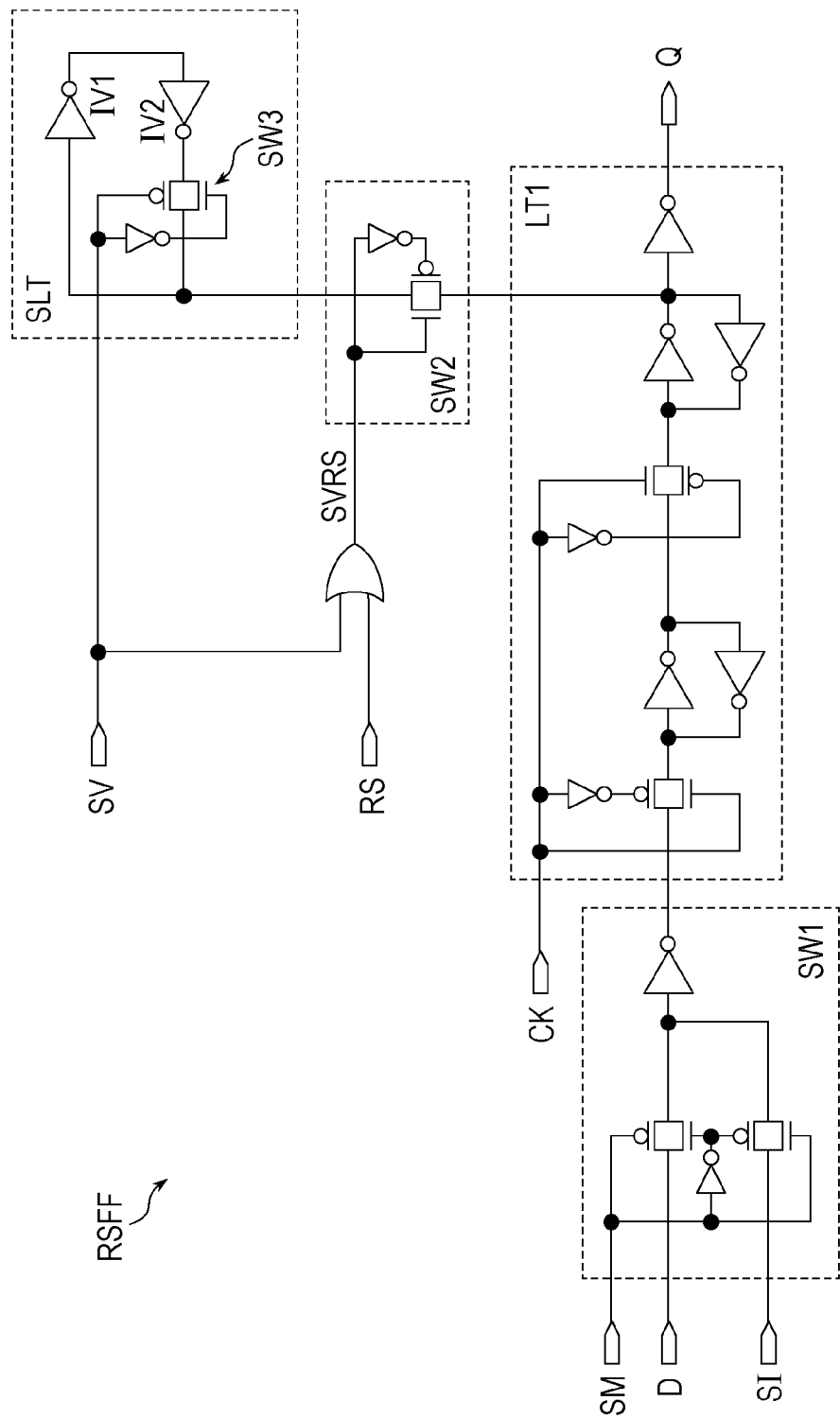
FIG. 12 is a diagram illustrating an example of a retention flip-flop illustrated in FIG. 11.

FIG. 12 illustrates an example of the retention flip-flop RSFF illustrated in FIG. 11. The retention flip-flop RSFF includes a switch SW2 and the shadow latch unit SLT in addition to the scanning flip-flop SFF illustrated in FIG. 7.

The switch SW2 connects, based on a save restore signal SVRS that is an OR logic of the save signal SV and the restore signal RS, a storage node of the latch unit LT1 to the shadow latch unit SLT. The switch SW2 is an example of a transfer unit that transfers data between the latch unit LT1 and the shadow latch unit SLT.

The shadow latch unit SLT includes a pair of inverters IV1 and IV2, the input of one of the inverters and the output of the other inverter are connected to each other, and includes a switch SW3 that interrupts a feedback path from the inverter IV2 to the inverter IV1 when the save signal SV is being outputted. The switch SW3 reduces, when logic is saved from the latch unit LT1 to the shadow latch unit SLT, collision of the logic from the latch unit LT1 with the logic outputted from the inverter IV2.

FIG. 13 illustrates an example of the chain control circuit CCNT2 illustrated in FIG. 11. FIG. 13 illustrates an example of the chain control circuit CCNT2 that is mounted to the function block unit FBLK1a in FIG. 11. The chain control circuit CCNT2 that is mounted to the function block unit FBLK3 or FBLKn in FIG. 2 is implemented by replacing the noise reduction signal NR1 with the noise reduction signal NR3 or the noise reduction signal NRn.

The chain control circuit CCNT2 includes flip-flops FFa, FFb, and FFc, the gate clock buffer GCB2, and various logic gates. The flip-flops FFa, FFb, and FFc are connected in series, and a data input terminal D of the flip-flop FFa receives the noise reduction signal NR1. The save signal SV, the noise reduction signal NR1a, and the restore signal RS are generated using the logics outputted from the output terminals Q of the two flip-flops out of the flip-flops FFa, FFb, and FFc.

FIGS. 14A and 14B illustrate an example of an operation of the chain control circuit CCNT2 illustrated in FIG. 13.

The chain control circuit CCNT2 outputs a save signal SV after a noise reduction signal NR1 is changed to the high level and before a noise reduction signal NR1a is changed to the high level ((a) in FIG. 14A). Thus, the logic that is held in the latch unit LT1 of the retention flip-flop RSFF is saved to the shadow latch unit SLT before generation of a clock CK1 that causes the retention flip-flop RSFF to perform a scanning operation.

Moreover, the chain control circuit CCNT2 causes the restore signal RS at a low level L to be changed to the high level after the noise reduction signal NR1a is changed to the low level and the generation of the clock CK1 is stopped ((b) in FIG. 14B). This causes the logic that is saved in the shadow latch unit SLT to be returned to the latch unit LT1 after the noise reduction mode is ended, so that the logic held in the retention flip-flop RSFF is restored to a value before the noise reduction mode.

As described above, also in the embodiment illustrated in FIG. 11 to FIG. 14B, similar to the embodiments illustrated in FIGS. 1 to 10, the occurrence of a power supply noise may be reduced by utilizing the retention flip-flops RSFF that are used for implementing the function of the semiconductor device. In addition, in the embodiment illustrated from FIGS. 11 to 14B, the semiconductor device includes the function block unit FBLK1a including the retention flip-flops RSFF, and the chain control circuit CCNT2 that generates the save signal SV and the restore signal RS. This allows a period of a scanning operation in the function block unit FBLK1a that is operated during the noise reduction mode to be set to any number of clock cycles. As a result, the current that is consumed during the noise reduction mode may be set more precisely than that in the scanning flip-flops SFF illustrated in FIG. 3.

Figure 15:
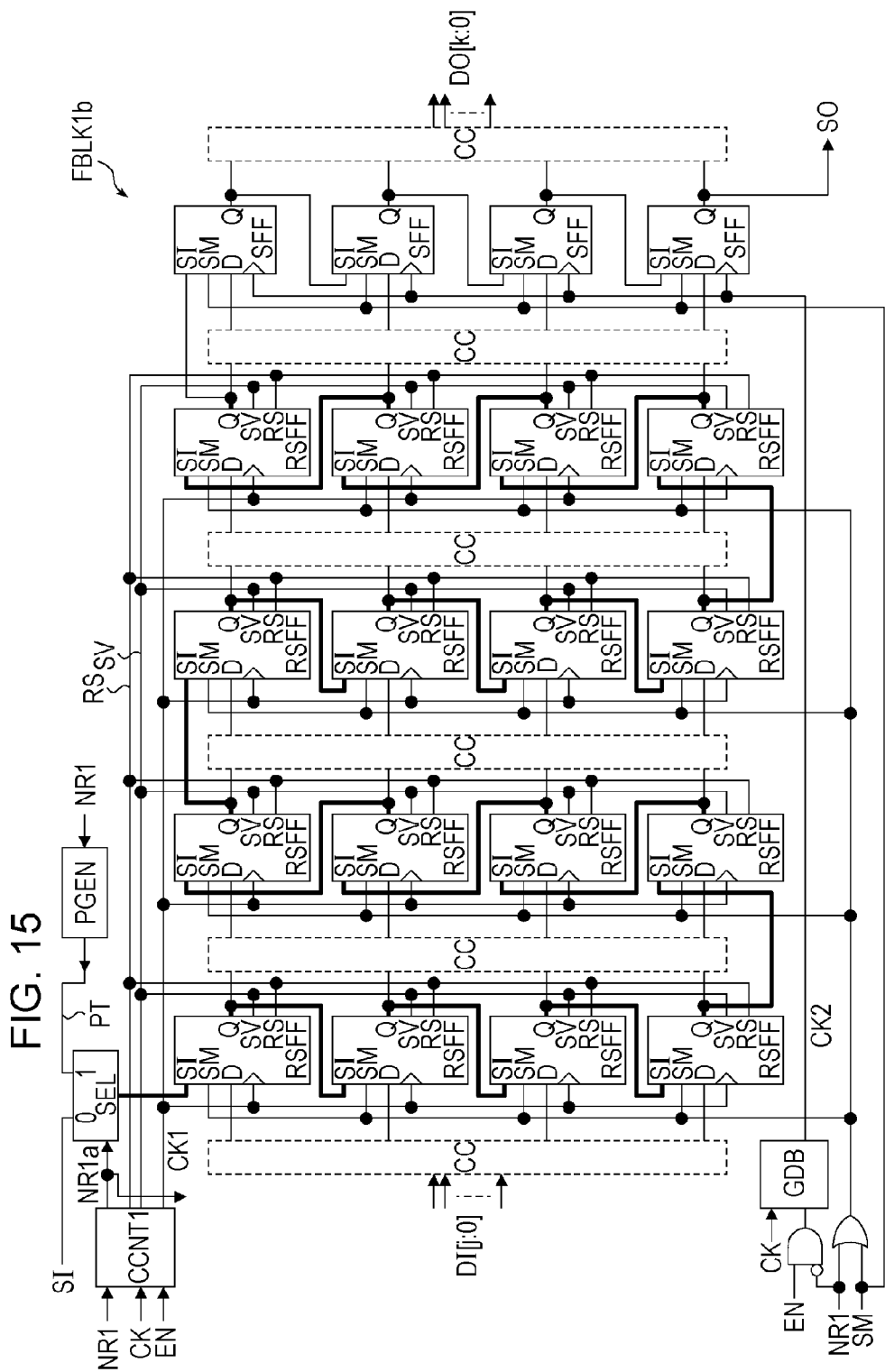
FIG. 15 is a diagram illustrating an example of a function block unit in a semiconductor device and a method of controlling the semiconductor device according to another embodiment.

FIG. 15 illustrates an example of a function block unit FBLK1b in a semiconductor device and a method of controlling the semiconductor device according to another embodiment. The semiconductor device includes the function block unit FBLK1b instead of the function block unit FBLK1 illustrated in FIG. 2. Moreover, the function block units FBLK3 and FBLKn illustrated in FIG. 2 have a configuration similar to that of the function block unit FBLK1b illustrated in FIG. 15, and receive noise reduction signals NR3 and NRn, respectively, instead of the noise reduction signal NR1. Other configuration of the semiconductor device is similar to that in FIG. 2. In other words, an operation control unit of the semiconductor device that includes the function block unit FBLK1b illustrated in FIG. 15 operates similar to that in FIG. 8, and the change in power supply current during the noise reduction mode is similar to that in FIG. 9.

The function block unit FBLK1b illustrated in FIG. 15 includes a pattern generator PGEN that supplies a serial logic pattern PT to the selector SEL during the noise reduction mode. The logic pattern PT is supplied to an input terminal that is assigned with "1" in the selector SEL, and successively transferred to the retention flip-flops RSFF through a path illustrated by the thick line during the noise reduction mode in which the noise reduction signal NR1 is set to the high level.

For example, the pattern generator PGEN generates the logic pattern PT in which a logic 1 and a logic 0 are repeated. This allows each retention flip-flop RSFF to alternately hold the logic 1 and the logic 0 during the noise reduction mode, so that the current consumption in the function block unit FBLK1b may be increased compared with a case where the same logic is continuously held.

Other configuration of the function block unit FBLK1*b* is similar to that of the function block unit FBLK1*a* illustrated in FIG. 11. Note that, although the pattern generator PGEN generates the logic pattern PT during a high level period of the noise reduction signal NR1, the pattern generator PGEN may generate the logic pattern PT during a high level period of the noise reduction signal NR1*a*. The operation in the function block unit FBLK1*b* during the noise reduction mode is similar to that in FIGS. 14A and 14B.

As described above, also in the embodiment illustrated in FIG. 15, similar to the embodiments illustrated in FIGS. 1 to 10, the occurrence of a power supply noise may be reduced by utilizing the retention flip-flops RSFF that are used for implementing the function of the semiconductor device. In addition, similar to the embodiment illustrated in FIGS. 11 to 14B, a period of a scanning operation in the function block unit FBLK1*b* that is operated during the noise reduction mode may be set to any number of clock cycles.

In addition, in the embodiment illustrated in FIG. 15, providing the logic pattern PT that is generated by the pattern generator PGEN to the retention flip-flops RSFF may increase the current consumption in the function block unit FBLK1*b* compared with a case where the same logic is continuously held. This may improve the current consumption efficiency during the noise reduction mode to allow reduction in the number of the retention flip-flops RSFF or the number of the function block units FBLK1 that are operated during the noise reduction mode.

Figure 16:
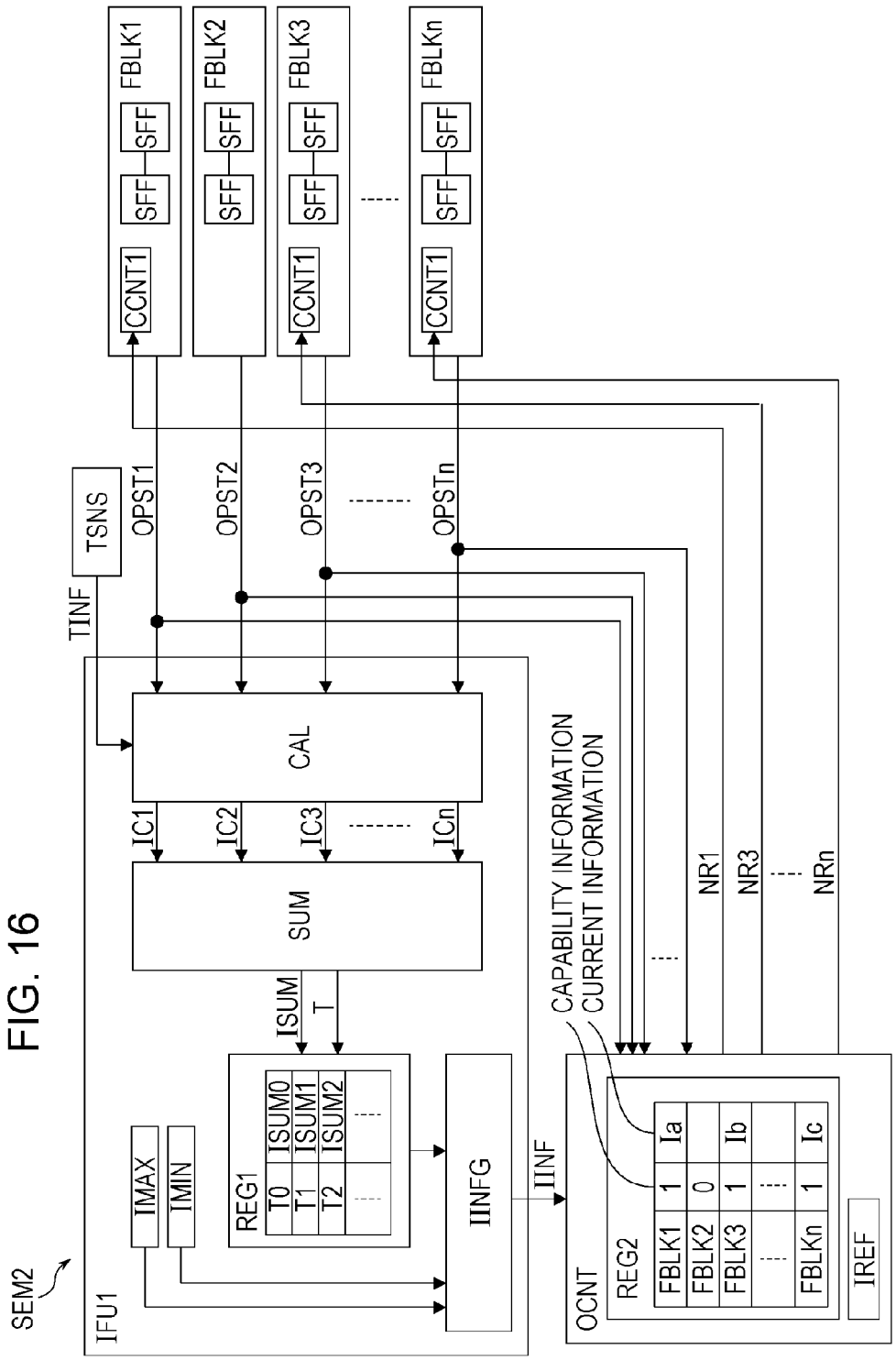
FIG. 16 is a diagram illustrating another embodiment of a semiconductor device and a method of controlling the semiconductor device.

FIG. 16 illustrates another embodiment of a semiconductor device and a method of controlling the semiconductor device. The elements the same as or similar to those illustrated in FIG. 2 are assigned with the same reference numerals, and detailed explanations thereof are omitted. A semiconductor device SEM2 illustrated in FIG. 16 further includes a temperature sensor TSNS in addition to the semiconductor device SEM1 illustrated in FIG. 2. The temperature sensor TSNS measures the chip temperature of the semiconductor device SEM2, and outputs temperature information TINF indicating the measured temperature to the current calculation unit CAL in the current prediction unit IFU1. The temperature sensor TSNS is an example of a temperature measurement unit.

The current calculation unit CAL presumes a leak current flowing in the semiconductor device SEM2 based on the temperature information TINF, and obtains a correction coefficient of a current consumption (operation current) for every function block unit FBLK that is obtained based on the operation state information OPST. The current calculation unit CAL then corrects the obtained current information IC (IC1, IC2, IC3, . . . , and ICn) using the estimated leak current and the obtained correction coefficient.

The current total unit SUM obtains a total ISUM of current values indicated by the corrected current information IC, and stores the obtained total ISUM in the register REG1. The current information generation unit IINFG obtains a tendency of the change in power supply current based on the total ISUM of the current values stored in the register REG1, and outputs current information IINF including the prediction of the variation amount of power supply current. The current information IINF is generated based on the current information IC that is corrected corresponding to the temperature. In other words, the current prediction unit IFU1 corrects the variation amount IINF based on the temperature measured by temperature sensor TSNS. This allows current information IC that is obtained by the current calculation unit CAL based on the operation state information OPST to be corrected to current information IC indicating the current that each function block unit FBLK actually consumes.

As described above, also in the embodiment illustrated in FIG. 16, similarly to the embodiments illustrated in FIGS. 1 to 10, the occurrence of a power supply noise may be reduced by utilizing the scanning flip-flops SFF that are used for implementing the function of the semiconductor device SEM2. In addition, in the embodiment illustrated in FIG. 16, the current calculation unit CAL corrects the current information IC using the temperature information TINF indicating the chip temperature, which allows the current information generation unit IINFG to generate the current information IINF based on the power supply current that changes depending on the temperature. As a result, the accuracy of the current information IINF may be more increased than a case where no temperature information TINF is used, and a waveform of the power supply current during the noise reduction mode may be brought closer to an ideal waveform.

Note that, temperature information TINF outputted from the temperature sensor TSNS may be outputted not to the current calculation unit CAL, but to the current information generation unit IINFG. In this case, the current information generation unit IINFG corrects the variation amount of power supply current included in the current information IINF based on the temperature information TINF. Moreover, a plurality of temperature sensors TSNS may be mounted to the semiconductor device SEM2. In addition, the temperature sensor TSNS may be mounted to the semiconductor device that includes the function block unit FBLK1*a* illustrated in FIG. 11 or the semiconductor device that includes the function block unit FBLK1*b* illustrated in FIG. 15.

Figure 17:
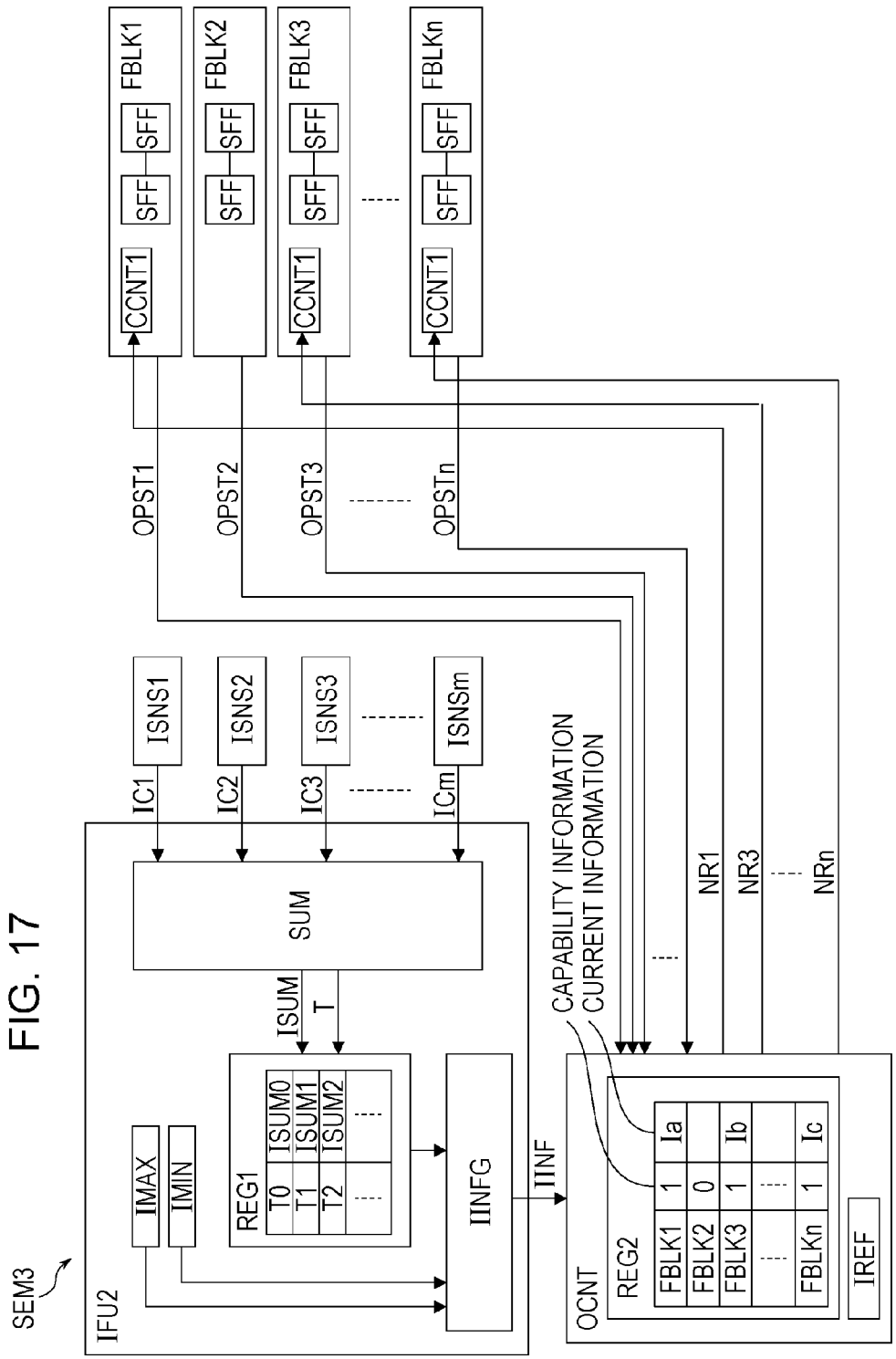
FIG. 17 is a diagram illustrating another embodiment of a semiconductor device and a method of controlling the semiconductor device.

FIG. 17 illustrates another embodiment of a semiconductor device and a method of controlling the semiconductor device. The elements the same as or similar to those illustrated in FIG. 2 are assigned with the same reference numerals, and detailed explanations thereof are omitted. A semiconductor device SEM3 illustrated in FIG. 17 includes a current prediction unit IFU2 instead of the current prediction unit IFU1 illustrated in FIG. 2. Moreover, the semiconductor device SEM3 includes m current sensors ISNS (ISNS1, ISNS2, ISNS3, . . . , and ISNSm) that measure the current consumed in a predetermined circuit region in the semiconductor device SEM3. The current sensor ISNS is an example of a current measurement unit.

The current prediction unit IFU2 is similar to the current prediction unit IFU1 illustrated in FIG. 2 except that no current calculation unit CAL is included. The current total unit SUM in the current prediction unit IFU2 obtains a total ISUM of current values indicated by current information IC (IC1, IC2, IC3, . . . , and ICm) indicating the current measured by the current sensors ISNS, and stores the obtained total ISUM in the register REG1. The current information generation unit IINFG obtains a tendency of the change in power supply current based on the total ISUM of the current values stored in the register REG1, and outputs current information IINF including the prediction of the variation amount of power supply current. In other words, the current prediction unit IFU2 predicts a variation amount of the current value based on the current measured by the current sensors ISNS1 to ISNSm, and outputs the variation amount as current information IINF.

The operation of the semiconductor device SEM3 is similar to the operation of the semiconductor device SEM1 illustrated in FIG. 2. In other words, the operation of the chain control circuit CCNT1 that is included in each of the function block units FBLK1, FBLK3, and FBLKn is similar to that in FIGS. 5A and 5B, the operation of the operation control unit OCNT is similar to that in FIG. 8, and the change in power supply current during the noise reduction mode is similar to that in FIG. 9.

The current information generation unit IINFG generates current information IINF based on the current measured by the current sensors ISNS to allow the higher accuracy of the current information IINF compared with a case where the current calculation unit CAL (FIG. 2) calculates the current based on the operation state information OPST. Moreover, the current information IINF may be generated without the current being calculated to allow the period of time before the current information IINF is generated to be shortened compared with that in the semiconductor device SEM1. As a result, a waveform of the power supply current during the noise reduction mode may be brought closer to an ideal waveform that allows reduction in the occurrence of a power supply noise.

As described above, also in the embodiment illustrated in FIG. 17, similarly to the embodiments illustrated in FIGS. 1 to 10, the occurrence of a power supply noise may be reduced by utilizing the scanning flip-flops SFF that are used for implementing the function of the semiconductor device SEM3. In addition, in the embodiment illustrated in FIG. 17, the accuracy of the current information IINF may be more increased, the time before the current information IINF is generated may be shortened, and a waveform of the power supply current during the noise reduction mode may be brought closer to an ideal waveform, compared with those in the semiconductor device SEM1 illustrated in FIG. 2.

Note that, the current sensors ISNS may be mounted to the semiconductor device that includes the function block unit FBLK1a illustrated in FIG. 11 or the semiconductor device that includes the function block unit FBLK1b illustrated in FIG. 15. In addition, the current sensors ISNS and the temperature sensor TSNS may be mounted to the semiconductor device that includes the function block unit FBLK1a illustrated in FIG. 11 or the semiconductor device that includes the function block unit FBLK1b illustrated in FIG. 15. When both of the current sensors ISNS and the temperature sensor TSNS are mounted to the semiconductor device, the current sensors ISNS measure the operation current of the function block units FBLK. Accordingly, the current calculation unit CAL does not correct the operation current of each function block unit FBLK, but corrects the leak current that depends on the temperature.

Moreover, the temperature sensor TSNS illustrated in FIG. 16 may be mounted to the semiconductor device SEM3 illustrated in FIG. 17. In this case, temperature information TINF outputted from the temperature sensor TSNS is outputted to the current total unit SUM or the current information generation unit IINFG, and is used for the correction of the current value corresponding to the leak current that depends on the temperature.

Figure 18:
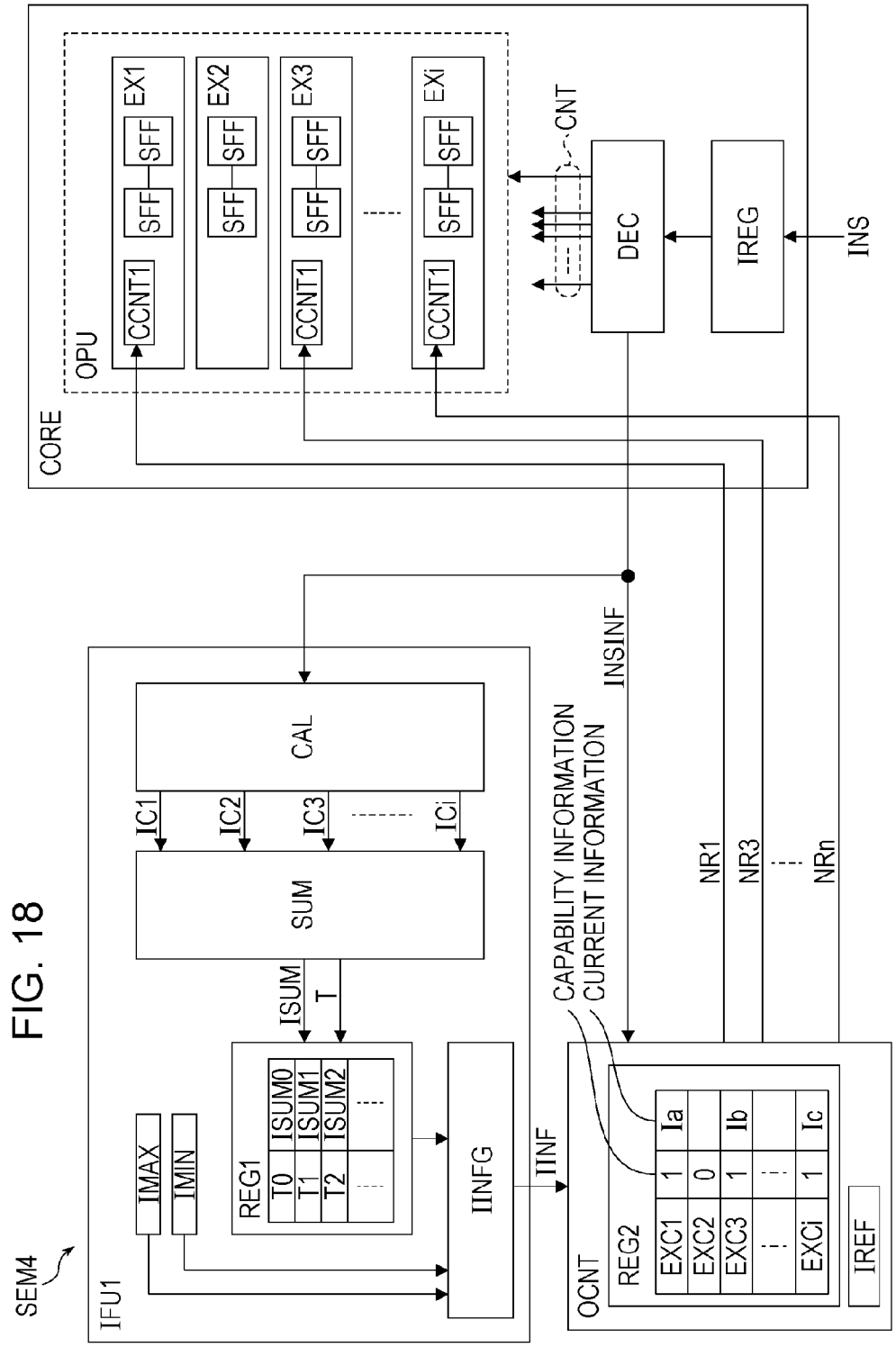
FIG. 18 is a diagram illustrating another embodiment of a semiconductor device and a method of controlling the semiconductor device.

FIG. 18 illustrates another embodiment of a semiconductor device and a method of controlling the semiconductor device. The elements the same as or similar to those illustrated in FIG. 2 are assigned with the same reference numerals, and detailed explanations thereof are omitted. A semiconductor device SEM4 illustrated in FIG. 18 is a processor such as a CPU, and includes a core CORE instead of the function block unit FBLK illustrated in FIG. 2. A current prediction unit IFU1 and an operation control unit OCNT operate by receiving instruction information INSINF from the core CORE, instead of the operation state information OPST illustrated in FIG. 2. The current prediction unit IFU1 and the operation control unit OCNT are similar to the current prediction unit IFU1 and the operation control unit OCNT illustrated in FIG. 2, except that the current prediction unit IFU1 and the operation control unit OCNT illustrated in FIG. 18 operate by receiving the instruction information INSINF.

The core CORE includes an instruction register IREG, a decoder DEC, and a computation unit OPU. The instruction register IREG holds an instruction code INS that the core CORE executes. The decoder DEC decodes the instruction code INS held by the instruction register IREG to output a control signal CNT for operating the core CORE, and output instruction information INSINF indicating the decoded instruction code INS.

The computation unit OPU includes i computing elements EX (EX1, EX2, EX3, . . . , and EXi) such as a floating point computing element and a fixed point computing element. Each computing element EX includes multiple scanning flip-flops SFF that are connected in series when being tested. Moreover, each of the computing elements EX1, EX3, and EXi includes the chain control circuit CCNT1. The computing elements EX1, EX3, and EXi have a configuration similar to that in FIG. 3, and the computing element EX2 has a configuration similar to that in FIG. 6. Each computing element EX is an example of the function block unit.

The current calculation unit CAL in the current prediction unit IFU1 obtains the current when the computation unit OPU executes the instruction code INS decoded by the decoder DEC for each computing element EX based on the instruction information INSINF, and outputs the obtained current as current information IC (IC1, IC2, IC3, . . . , and ICi). Further, the decoder DEC outputs the instruction information INSINF before the computation unit OPU executes the instruction code INS. The operation of the current prediction unit IFU1 except the operation of the current calculation unit CAL is similar to the operation of the current prediction unit IFU1 in FIG. 2. In other words, the current prediction unit IFU1 predicts a variation amount of the power supply current based on the instruction code INS decoded by the decoder DEC, and outputs the variation amount as the current information IINF.

Note that, the instruction is executed in the computation unit OPU typically by a pipe line process, and the execution takes a time of one to several clock cycles before each computing element EXi actually starts the operation after the instruction is decoded in the decoder DEC. During the period, the current prediction described above and the operations of the scanning flip-flops SFF may be started. In addition, in a multi-core system provided with a plurality of the cores CORE in which each core is dynamically started up and stopped if desired, when a specific core is newly started up, such a step is present as to start up the core itself before the computation unit OPU inside the core actually starts an operation. Therefore, a sufficient period of time for the noise reduction as described above is present after the decoder DEC decodes an instruction code for such a start-up and before the computing elements (which most consume the current) actually start operations.

The operation control unit OCNT is similar to the operation control unit OCNT illustrated in FIG. 2 except that the register REG2 includes a region in which capability information and current information are held for each computing element EX. The operation control unit OCNT detects non-operating function block units that are computing elements EX the operation of which is stopped based on the instruction information INSINF, and selects a computing element EX to be shifted to the noise reduction mode out of the computing elements EX the operation of which is stopped. Further, the operation control unit OCNT outputs noise reduction signals NR (NR1, NR3, and NRi) corresponding to the selected computing elements EX.

In the semiconductor device SEM4, the operation of the chain control circuit CCNT1 is similar to that in FIGS. 5A and 5B, the operation of the operation control unit OCNT is similar to that in FIG. 8, and the change in power supply current during the noise reduction mode is similar to that in FIG. 9.

As described above, also in the embodiment illustrated in FIG. 18, similar to the embodiments illustrated in FIGS. 1 to 10, the scanning flip-flops SFF in the computing element EX the operation of which is stopped are caused to perform a scanning operation. This allows the occurrence of a power supply noise to be reduced by utilizing the scanning flip-flops SFF that are used for implementing the function of the semiconductor device SEM4.

Note that, the computing element EX may include retention flip-flops RSFF illustrated in FIG. 11 instead of the scanning flip-flops SFF. In this case, the computing element EX may include the pattern generator PGEN illustrated in FIG. 15. Moreover, the semiconductor device SEM4 may include the temperature sensor TSNS illustrated in FIG. 16, or may include the current sensors ISNS illustrated in FIG. 17. In addition, when the semiconductor device SEM4 of an SoC form includes the core CORE and the function block unit FBLK, the current calculation unit CAL may receive the instruction information INSINF from the core CORE and the operation state information OPST from the function block unit FBLK. In this case, the current prediction unit IFU1 generates current information IINF based on the instruction information INSINF and the operation state information OPST. The operation control unit OCNT outputs the noise reduction signal NR to at least one of the computing element EX and the function block unit FBLK that include the chain control circuit CCNT1, based on the current information IINF.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a plurality of function block units each including a plurality of latch circuits;
   a current prediction unit that predicts a variation amount of current consumed by each of the function block units;
   an operation control unit that, if any of the variation amounts predicted by the current prediction unit exceeds a threshold value, operates the latch circuits included in a predetermined number of target function block units for a predetermined period, the predetermined number of target function block units being chosen from function block units not operating among the plurality of function block units; and
   a restore control unit that, after the predetermined period passes, restores information held by the latch circuits included in the predetermined number of target function block units, to information held by the latch circuits before the operation for the predetermined period.

2. The semiconductor device according to claim 1, wherein
   the restore control unit includes a connection unit that circularly connects the plurality of latch circuits if any of the variation amounts predicted by the current prediction unit exceeds the threshold value, and
   the predetermined period is set based on a cycle in which the information held by the plurality of circularly connected latch circuits is restored to the information held by the plurality of latch circuits before the operation for the predetermined period.

3. The semiconductor device according to claim 2, wherein
   the operation control unit includes a count unit that counts a number of shifts in the circularly connected latch circuits if any of the variation amounts exceeds the threshold value, and
   a time for completing the predetermined period is set to a time when the count unit is to complete counting of a number of the circularly connected latch circuits or an integral multiple of the number.

4. The semiconductor device according to claim 1, wherein
   the plurality of latch circuits are a plurality of retention flip-flops that are connected in series with each other, and that each include:
   a first latch unit that holds data during a normal mode in which the function block units each implement corresponding functions, and holds a test pattern during a test mode in which the function block units are each tested;
   a second latch unit in which the data held by the first latch unit is saved; and
   a transfer unit that transfers the data between the first latch unit and the second latch unit, and
   the restore control unit saves the data held by the first latch unit in the second latch unit before the plurality of latch circuits operate for the predetermined period, and restores the data saved in the second latch unit to the first latch unit after the predetermined period has passed.

5. The semiconductor device according to claim 4, further comprising a pattern generation unit that generates a pattern to be inputted to the plurality of latch circuits for the predetermined period.

6. The semiconductor device according to claim 1, wherein
   the current prediction unit includes a current calculation unit that obtains current estimated to be consumed by each of the plurality of function block units, based on information indicating an operation state of the function block unit, and
   the current prediction unit predicts the variation amounts based on the current obtained by the current calculation unit.

7. The semiconductor device according to any one of claim 1, further comprising a plurality of current measurement units that measure currents consumed by the plurality of function block units, wherein
   the current prediction unit predicts the variation amounts based on the currents measured by the current measurement units.

8. The semiconductor device according to claim 1, comprising:

a plurality of computing elements that execute computation; and a decoder that decodes an instruction code indicating an instruction to be executed by the computing elements, wherein the plurality of function block units are the computing elements, the current prediction unit predicts the variation amounts based on the instruction code decoded by the decoder, and the operation control unit detects the target function block units based on the instruction code decoded by the decoder.

9. The semiconductor device according to claim 1, further comprising a temperature measurement unit that measures a temperature of the semiconductor device, wherein the current prediction unit corrects the variation amounts based on the temperature measured by the temperature measurement unit.

10. The semiconductor device according to claim 1, wherein the plurality of latch circuits are scanning flip-flops each including a latch unit that holds data during a normal mode in which the function block units implement corresponding functions, and holds a test pattern during a test mode in which the function block units are each tested.

11. A method of controlling a semiconductor device that includes a plurality of function block units each including a plurality of latch circuits, the method comprising:

causing a current prediction unit in the semiconductor device to predict a variation amount of current to be consumed by each of the plurality of function block units;

causing an operation control unit in the semiconductor device to, if any of the variation amounts predicted by the current prediction unit exceeds a threshold value, operate the latch circuits included in a predetermined number of target function block units for a predetermined period, the predetermined number of target function block units being chosen from function block units not operating among the plurality of function block units; and causing a restore control unit in the semiconductor device to, after the predetermined period passes, restore information held by the latch circuits included in the predetermined number of target function block units, to information held by the latch circuits before the operation for the predetermined period.

* * * * *